United States Patent
Yamamoto et al.

(10) Patent No.: US 7,864,090 B2
(45) Date of Patent: Jan. 4, 2011

(54) ANALOG-TO-DIGITAL CONVERTING APPARATUS WITH LOWER TEMPERATURE DEPENDENCE

(75) Inventors: Hiroyoshi Yamamoto, Nagoya (JP); Hiroshi Tamura, Nagoya (JP)

(73) Assignee: Denso Corporation, Kariya (JP)

( * ) Notice: Subject to any disclaimer, the term of this patent is extended or adjusted under 35 U.S.C. 154(b) by 24 days.

(21) Appl. No.: 12/366,880

(22) Filed: Feb. 6, 2009

(65) Prior Publication Data

US 2009/0195430 A1    Aug. 6, 2009

(30) Foreign Application Priority Data

Feb. 6, 2008    (JP)  ............... 2008-025962

(51) Int. Cl.
*H03M 1/06*    (2006.01)
(52) U.S. Cl. ............... 341/119; 341/117; 341/118; 341/155
(58) Field of Classification Search ......... 341/117–120, 341/155
See application file for complete search history.

(56) References Cited

U.S. PATENT DOCUMENTS

| | | | |
|---|---|---|---|
| 5,396,247 A | | 3/1995 | Watanabe et al. |
| 5,528,200 A | * | 6/1996 | Yamauchi et al. ............ 331/45 |
| 6,362,627 B1 | | 3/2002 | Shimamoto et al. |
| 6,891,491 B2 | | 5/2005 | Nakamura et al. |
| 2007/0080844 A1 | * | 4/2007 | Terazawa et al. ............ 341/155 |
| 2007/0257642 A1 | * | 11/2007 | Xiao et al. ................ 320/134 |

FOREIGN PATENT DOCUMENTS

| | | |
|---|---|---|
| JP | 05-259907 | 10/1993 |
| JP | 11-248755 | 9/1999 |
| JP | 2004-274157 | 9/2004 |

OTHER PUBLICATIONS

Japanese Office Action dated Oct. 27, 2009, issued in corresponding Japanese Application No. 2008-025962, with English translation.

* cited by examiner

*Primary Examiner*—Jean B Jeanglaude
(74) *Attorney, Agent, or Firm*—Nixon & Vanderhye, PC

(57) ABSTRACT

In an A/D converting apparatus, a converting unit has an input terminal and an input-output characteristic. The input-output characteristic has temperature dependence, and the converting unit carries out a process of converting an input voltage signal to digital data. A temperature determining unit has information representing a relationship between a variable of an output of the converting unit and a variable of a temperature around the converting unit according to the temperature dependence of the input-output characteristic of the converting unit. When the specified voltage is applied to the input terminal of the converting unit, the temperature determining unit determines a value of the temperature around the converting unit based on the information and the specified voltage. A reducing unit reduces temperature dependence of the process of converting an input voltage signal to digital data based on the determined value of the temperature around the converting unit.

16 Claims, 19 Drawing Sheets

UEi(1E)

ANALOG-TO-DIGITAL CONVERTING APPARATUS WITH LOWER TEMPERATURE DEPENDENCE

CROSS REFERENCE TO RELATED APPLICATIONS

This application is based on Japanese Patent Application 2008-025962 filed on Feb. 6, 2008. This application claims the benefit of priority from the Japanese Patent Application, so that the descriptions of which are all incorporated herein by reference.

FIELD OF THE INVENTION

The present invention relates to analog-to-digital (A/D) converting apparatuses with an A/D converter for converting an input analog voltage signal to digital data.

BACKGROUND OF THE INVENTION

As conventional A/D converters, time A/D converters, referred to as TAD converters, have been developed. Examples of such TAD converters are disclosed in U.S. Pat. No. 5,396,247 corresponding to Japanese Patent Application Publication No. H05-259907.

TAD converters are each provided with a ring oscillator operating on an input analog voltage signal, and achieve high-resolution with a simple circuit structure.

TAD converters have normally nonlinear output characteristics that vary with variation in temperature. For this reason, in order to grasp a value of an input analog voltage signal based on the output of a TAD converter, it is desired to associate a variable of the TAD-converter output with that of an input analog voltage signal in accordance with its nonlinear input-output characteristic while the temperature dependence of the TAD-converter output is considered.

U.S. Pat. No. 6,891,491 corresponding to Japanese Patent Application Publication No. 2004-274157 discloses a method for approximating the input-output characteristic of a TAD converter. The method approximates the input-output characteristic of a TAD converter using polygonal line based on output values of the TAD converter corresponding to reference voltages in the input analog voltage signal within a preset input range, such as the upper limit, lower limit, and median value therein.

SUMMARY OF THE INVENTION

Because the polygonal line approximates the input-output characteristic of the TAD converter at a current temperature with high accuracy, the method can improve the A/D conversion accuracy using TAD converters.

As described above, TAD converters are designed to convert an input analog voltage signal to digital data, and therefore, they can be used as voltage detectors.

On the other hand, in using, as a power source, a battery pack consisting of a group of series-connected battery cells, it is desired to measure a voltage value across each of battery modules; each of these battery modules consists of one battery cell or a set of some adjacent battery cells. In order to address the desire, a TAD converter can be applied as a voltage detector of a voltage monitoring system for a battery pack; this voltage detector works to measure a voltage value across each of the battery modules.

When TAD converters each designed to use the aforementioned approximation method are applied as the voltage detector of the voltage monitoring system for a battery pack, reference voltages in an input analog voltage signal to be applied to each TAD converter need be generated on the condition that the negative terminals of the battery modules serve as ground potential.

For this reason, the reference voltages to be applied to a TAD converter arranged to measure a voltage value across the highest-potential battery module cannot be generated by stepping down the voltage value across another battery module.

In contrast, when the voltage value across the highest-potential battery module is stepped down in order to generate the reference voltages, each of the reference voltages that can be generated by the stepping-down is limited to be equal to or lower than the voltage value across the highest-potential battery module. Thus, it may be difficult to properly generate, as a reference voltage, the upper limit in the input analog voltage signal.

In order to address such a problem, in place of directly applying, to a corresponding TAD converter, the voltage value across each battery module, indirectly applying, to a corresponding TAD converter, a voltage value can be devised; this voltage value is created by dividing the voltage value across each battery module by resistors. This narrows a voltage range to be applied to the TAD converter, thus reducing, as a reference voltage, the upper limit in the input analog voltage signal.

However, resistances of the resistors used to divide the voltage value across each battery module may depend on temperature. This may result in reducing the accuracy of converting the input analog voltage signal into digital data, in other words, reducing the accuracy of measuring voltage values in the input analog voltage signal.

Such problems due to the temperature dependence of elements are not limited to occur in an A/D converting process carried out by a TAD converter and a resistor.

Specifically, such problems due to the temperature dependence of elements may occur in an A/D converting process to be carried out by an AD converter and an electronic element for directly or indirectly inputting a target physical quantity to the AD converter; the operating characteristic of this electronic element has a temperature dependence.

In view of the circumstances set force above, an object of an aspect of the present invention is to provide analog-to-digital converting apparatuses, which are designed to have an improved structure to reduce temperature dependence of a process for converting an input voltage signal into digital data.

According to one aspect of the present invention, there is provided an analog-to-digital converting apparatus. The analog-to-digital converting apparatus includes a converting unit having an input terminal and an input-output characteristic. The input-output characteristic has temperature dependence. The converting unit is configured to carry out a process of converting an input voltage signal through the input terminal to digital data. The analog-to-digital converting apparatus includes a specified voltage applying unit configured to apply a specified voltage to the input terminal of the converting unit. The analog-to-digital converting apparatus includes a temperature determining unit having information representing a relationship between a variable of an output of the converting unit and a variable of a temperature around the converting unit according to the temperature dependence of the input-output characteristic of the converting unit. The temperature determining unit is configured to, when the specified voltage is applied to the input terminal of the converting unit, determine a value of the temperature around the converting unit based on the information and the specified voltage. The analog-todigital converting apparatus includes a reducing unit configured to reduce temperature dependence of the process of converting the input voltage signal to the digital data based on the determined value of the temperature around the converting unit.

According to the one aspect of the present invention, the information representing the relationship between the variable of the output of the converting unit and the variable of the temperature around the converting unit according to the temperature dependence of the input-output characteristic of the converting unit is provided.

Thus, when the specified voltage is applied to the input terminal of the converting unit, the temperature determining unit determines a value of the temperature around the converting unit based on the information and the specified voltage.

Thus, based on the determined value of the temperature around the converting unit, the reducing unit can understand the effects of the temperature on the process of converting an input voltage signal through the input terminal to digital data, thus properly reducing the effects of the temperature on the A/D converting process.

The apparatus therefore makes it possible to properly reduce the temperature dependence of the A/D converting process.

BRIEF DESCRIPTION OF THE DRAWINGS

Other objects and aspects of the invention will become apparent from the following description of embodiments with reference to the accompanying drawings in which.

DETAILED DESCRIPTION OF EMBODIMENTS OF THE INVENTION

Embodiments of the present invention will be described hereinafter with reference to the accompanying drawings. In the embodiments, A/D converting apparatuses according to the present invention are applied to voltage monitoring systems each installed in a hybrid vehicle.

First Embodiment

Figure 1:
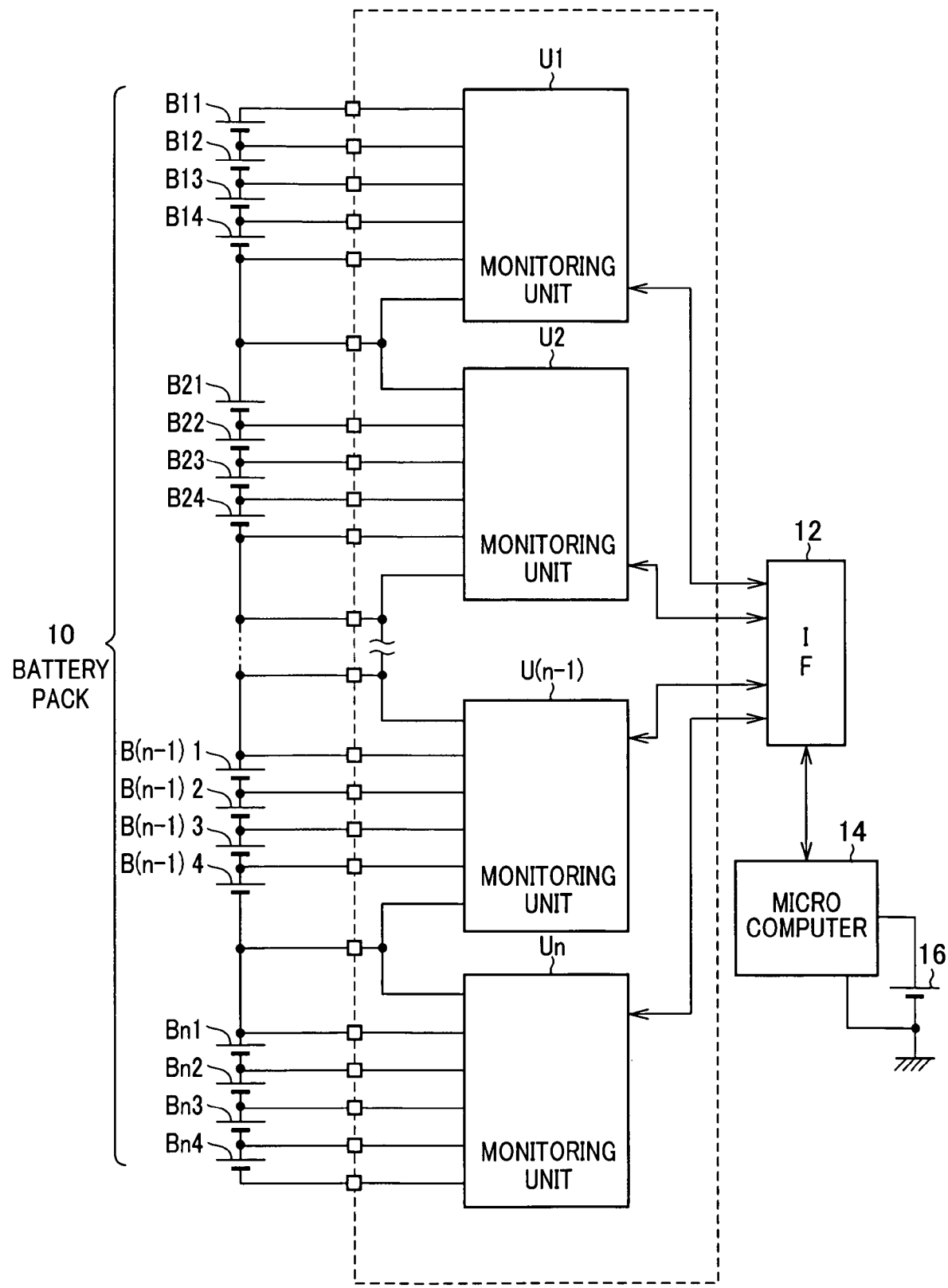
FIG. 1 is a block diagram schematically illustrating an example of the overall structure of a voltage monitoring system according to a first embodiment of the present invention.

Referring to the drawings, in which like reference characters refer to like parts in several views, there is illustrated in FIG. 1 an example of the overall structure of a voltage monitoring system 1 according to the first embodiment of the present invention.

The voltage monitoring system 1 includes a battery pack 10, a plurality of monitoring units U, an interface (IF) 12, a microcomputer 14, and a low battery 16.

The battery pack 10 is designed as a power source for a motor generator installed in the hybrid vehicle.

Specifically, the battery pack 10 consists of a group of series-connected battery cells each is a secondary cell, such as lithium secondary cell or nickel secondary cell.

Any one of the series-connected battery cells is represented by Bij. The subscript i represents any one of 1, 2, 3, . . . n (n is an integer equal to or greater than 2), and the subscript j represents any one of 1, 2, 3, 4. In other words, the battery pack 10 is divided into n battery blocks (modules) B1j, B2j, ..., B(n-1)j, and Bnj of four adjacent battery cells each.

The number of the plurality of monitoring units U and that of the plurality of battery blocks B1j to Bnj are equal to each other.

Specifically, each cell of each of the battery blocks B1j to Bnj is electrically connected to a corresponding one monitoring unit Ui; this subscript i represents any one of 1, 2, 3, ..., n (n is an integer equal to or greater than 2). Each of the monitoring units U1 to Un works to monitor the state of each cell of a corresponding one of the battery blocks B1j to Bnj.

For example, four adjacent battery cells B11, B12, B13, and B14 of the first battery block (i=1) are electrically connected to the first monitoring unit U1 (i=1), and four adjacent battery cells Bn1, Bn2, Bn3, and Bn4 of the n-th battery block (i=n) are electrically connected to the n-th monitoring unit Un (i=n).

The monitoring units U1 to Un, the battery pack 10, and the motor generator (not shown) constitute a high-voltage system for supplying a high voltage to electrical loads installed in the hybrid vehicle, On the other hand, the low voltage battery 16 and the microcomputer 14 operating on a voltage supplied from the low voltage battery 16 constitute a low-voltage system. Each of the monitoring units U1 to Un and the microcomputer 14 is electrically connected to each other through the interface 12 so that electrical signals can be communicated with each other therethrough.

The microcomputer 14 consists of, for example, a CPU, a RAM (Random Access Memory), a ROM (Read Only Memory), such as a rewritable ROM, a storage device, such as a HDD (Hard Disk Drive), and peripherals. The microcomputer 14 is programmed to control the operations of the monitoring units U1 to Un.

Figure 2:
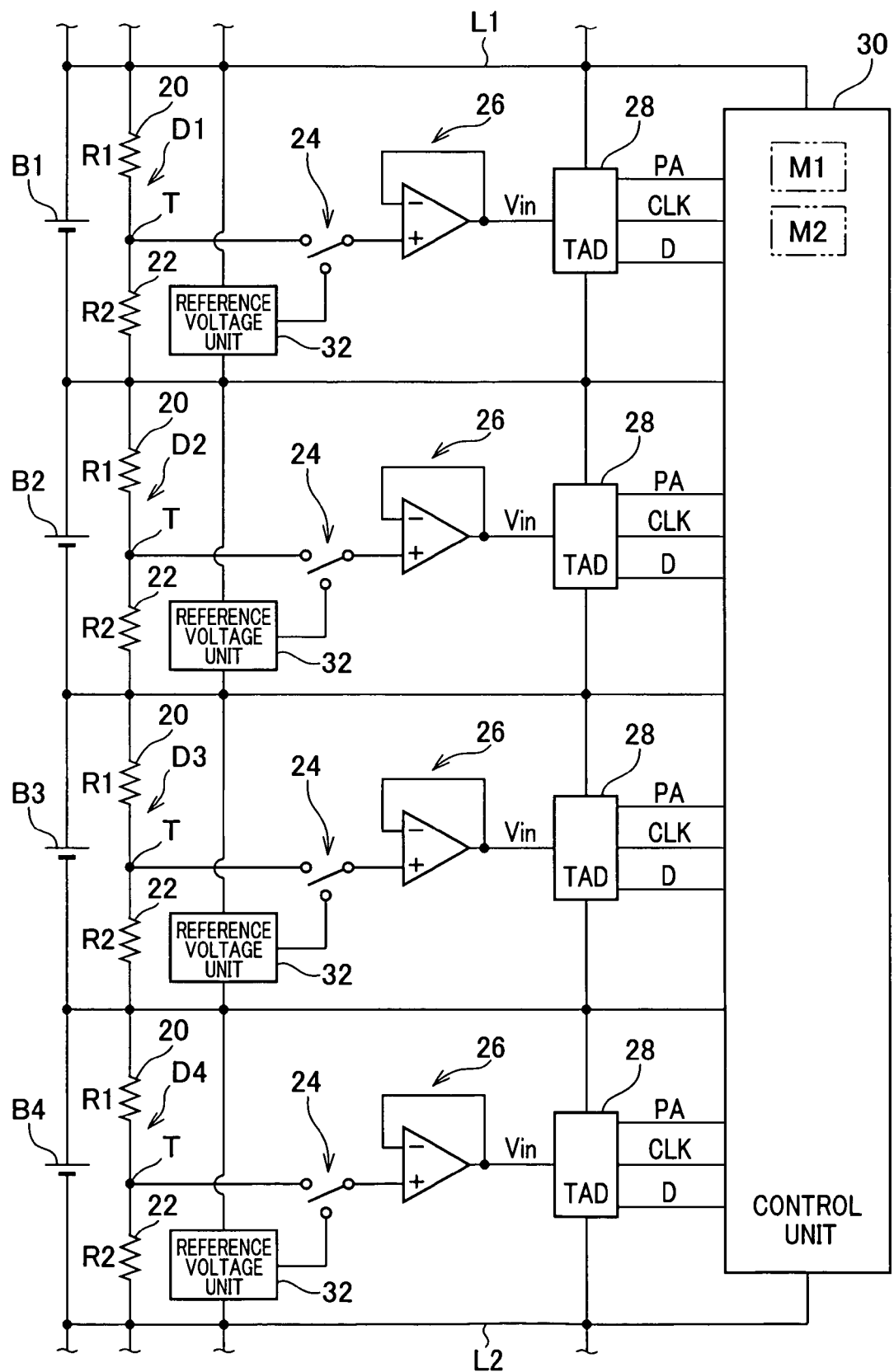
FIG. 2 is a circuit diagram schematically illustrating an example of the circuit structure of any one of monitoring units illustrated in FIG. 1.

FIG. 2 illustrates an example of the schematic circuit structure of any one unit Ui of the monitoring units U1 to Un. In FIG. 2, four adjacent cells Bi1, Bi2, Bi3, and Bi4 to be monitored by a monitoring unit Ui are abbreviated as B1, B2, B3, and B4, respectively. Any one of the abbreviated adjacent cells B1, B2, B3, and B4 is referred to as Bj.

Each monitoring unit Ui is provided with four voltage dividers D1, D2, D3, and D4 each consisting of a pair of first and second resistors 20 and 22 that are connected to each other in series through an output terminal (connecting point) T. The first resistor 20 has a resistance of R1, and the second resistor 22 has a resistance of R2. Each of the voltage dividers is electrically connected across a corresponding one of the four adjacent cells B1, B2, B3, and B4. In other words, a resistive element consisting of series-connected first and second resistors 20 and 22 is placed across each of the four adjacent cells B1, B2, B3, and B4.

Each of the voltage dividers D1 to D4 works to divide the voltage across a corresponding one (Bj) of the adjacent cells B1 to B4.

Each monitoring unit Ui is also provided with four selectors 24, four voltage followers 26, four time A/D converters (TAD converters) 28, a control unit 30, and four reference voltage units 32.

The divided value of the voltage across each of the adjacent cells B1 to B4 by a corresponding one of the voltage dividers D1 to D4 is outputted from the corresponding output terminal T to be inputted to a corresponding one of the four selectors 24.

Specifically, each of the selectors 24 is electrically connected to the output terminal T of a corresponding one of the first to fourth voltage dividers D1 to D4, and to a non-inverting input terminal (+) of a corresponding one of the voltage followers 26. This allows the divided value of the voltage across each of the adjacent cells B1 to B4 to be applied to a corresponding one of the voltage followers 26 via a corresponding one of the selectors 24.

Each of the selectors 24 is also electrically connected to an output of a corresponding one of the reference voltage units 32 and to the control unit 30. Specifically, each of the selectors 24 is also operative to select an output of each of the reference voltage units 32 to the non-inverting terminal of a corresponding one of the voltage followers 26 under control of the control unit 30.

Each of the voltage followers 26 has an output terminal and an inverting input terminal (−) short-circuited to the output terminal.

Specifically, each of the voltage followers 26 has a high input impedance that allows a current inputted to the non-inverting input terminal from the output terminal of a corresponding one of the voltage dividers D1 to D4 to become nearly zero. This reduces a leakage current from the output terminal of each of the voltage dividers D1 to D4 that is dividing the voltage across a corresponding one of the adjacent cells B1 to B4. This makes it possible to measure the divided value of the voltage across each of the adjacent cells B1 to B4 based on the resistances R1 and R2 of a corresponding one of the voltage dividers D1 to D4 with high accuracy.

The output terminal of each of the voltage followers 26 is electrically connected to an input terminal of a corresponding one of the TAD converters 28. This allows the divided value of the voltage across each of the adjacent cells B1 to B4 to be applied to the input terminal of a corresponding one of the TAD converters 28 as an input analog voltage signal Vin. The input analog voltage signal Vin will be referred to as "input voltage signal Vin" hereinafter.

The control unit 30 is designed as, for example, a normal computer circuit. Specifically, the control unit 30 consists of, for example, a CPU, a RAM (Random Access Memory), a ROM (Read Only Memory), such as a rewritable ROM, a storage device, such as a HDD (Hard Disk Drive), and peripherals. The control unit 30 is electrically connected to each of the electors 24, each of the TAD converters 28, a line L1 electrically connected to a positive terminal of the cell B1, and a line L2 electrically connected to a negative terminal of the cell B4.

Each of the TAD converters 28 is electrically connected across a corresponding one cell Bj and is configured to operate on the voltage across a corresponding one cell Bj as its power supply voltage. Specifically, a positive power supply terminal and a ground terminal of each of the TAD converters 28 are electrically connected to the positive terminal and the negative terminal of a corresponding one cell Bj, respectively.

Specifically, the control unit 30 is operative to:

control each of the selectors 24;

output a pulse signal PA to each of the TAD converters 28;

output, to each of the TAD converters 28, a clock signal CLK consisting of a repetitive series of pulses with a preset clock cycle;

fetch digital data D outputted from each of the TAD converters 28; and subject the fetched digital data D outputted from each of the TAD converters 28 to digital processing.

Figure 3:
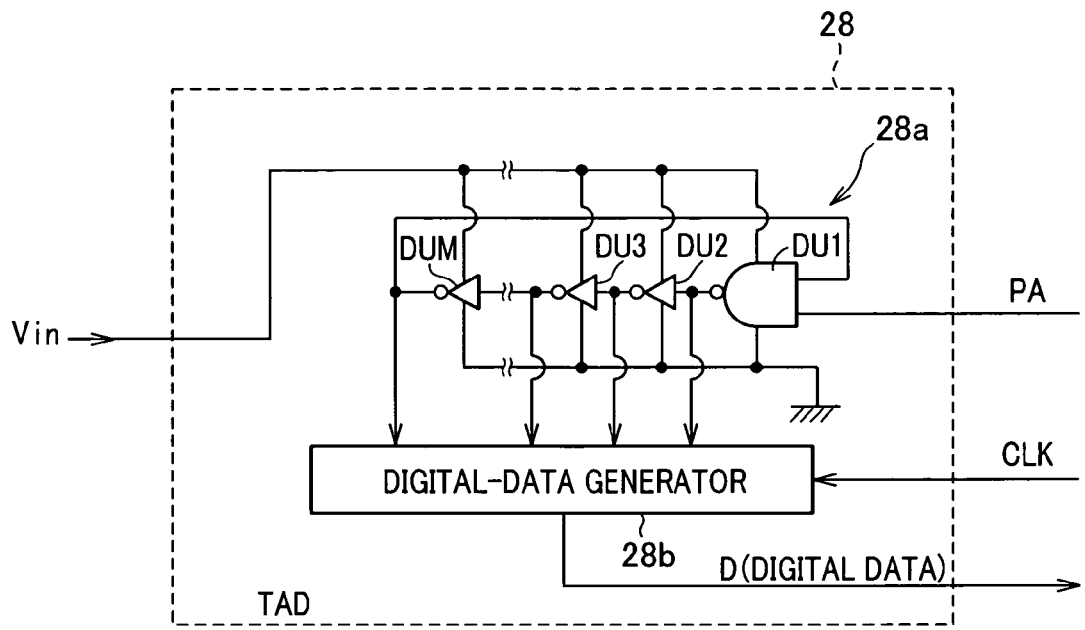
FIG. 3 is a circuit diagram schematically illustrating an example of the structure of any one of TAD converters illustrated in FIG. 2.

Referring to FIG. 3, each of the TAD converters 28 includes, as a pulse delay circuit, a ring oscillator 28a and a digital-data generator 28b.

The ring oscillator 28a consists of a number of M of delay units DU that corresponds to the number M of stages in delay. The M is set to an even number.

Specifically, as the delay units DU, a NAND gate DU1 and an odd number of, inverters DU2 to DUM are preferably used.

The NAND gate DU1 has one and the other input terminals and one output terminal, and is designed such that the pulse signal PA given from the control unit 30 is inputted to the one input terminal thereof.

The NAND gate DU1 and the inverters DU2 to DUM are connected in series in a ring. Specifically, the other input terminal of the NAND gate DU1 and an output terminal of the final stage of inverter DUM are connected to each other so that the NAND gate DU1 and the inverters DU2 to DUM are serially connected to have a ring-like structure, constituting the ring oscillator 28*a*.

The ring oscillator 28*a* is operative to adjust the level of the pulse signal PA input to the NAND gate DU1 via the other input terminal thereof so as to continuously circulate the pulse signal PA through the delay units DU.

The input terminal of each of the TAD converters 28 to which the input voltage signal Vin outputted from a corresponding one of the voltage followers 26 is applied serves as a power supply terminal thereof.

For this reason, an inverting operation time (oscillating frequency) of each of the delay units DU depends on the level of the input voltage signal Vin, and therefore, the delay time of each delay unit DU depends on the level of the input voltage signal Vin. For this reason, the number of stages of the delay units DU through which the pulse signal PA has passed within a predetermined sampling period TS equivalent to one cycle of the clock signal CLK is configured to be proportional to the level of the input voltage signal Vin.

The digital data generator 28*b* is operative to:

count the number of times the pulse signal PA outputted from the ring oscillator 28*a* is inverted within each clock cycle of the clock signal CLK;

detect a position that a significant edge of the pulse signal PA has reached every time the clock signal CLK is turned high; and generate the digital data D based on the counted number of times and the detected position of the significant edge of the pulse signal PA to thereby output the digital data D.

Figure 4:
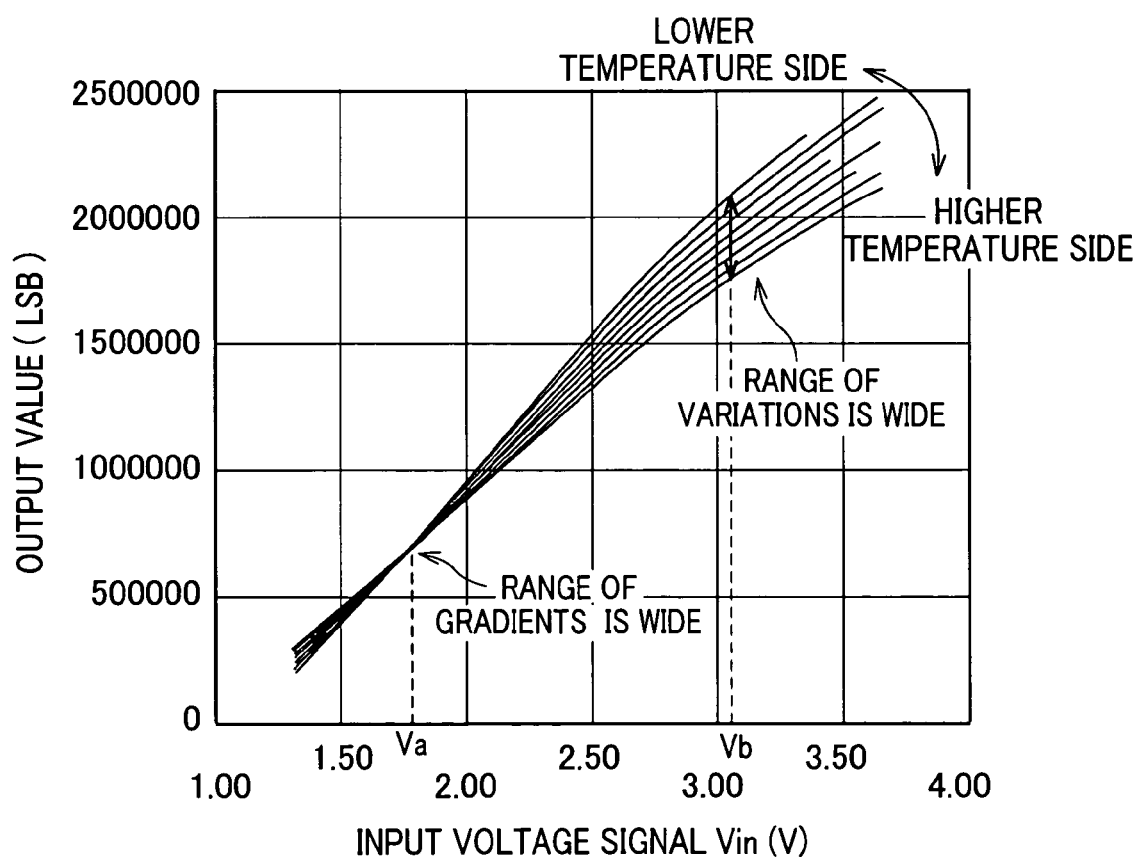
FIG. 4 is a graph schematically illustrating output characteristic curves of any one of the TAD converters illustrated in FIG. 2.

FIG. 4 schematically illustrates input-output characteristic curves of a TAD converter 28. The input-output characteristic curve(s) will be referred to as "output characteristic curve(s)" hereinafter.

Referring to FIG. 4, as the output characteristic curves of the TAD converter 28, the relationships between variables of the input voltage signal Vin in units of voltage (V) and those of the output digital data D in units of LSB (least Significant Bit) are plotted as nonlinear curves that vary depending on temperature. The nonlinear output characteristic curves of a TAD converter 28 may be different from those of another TAD converter 28.

For example, in FIG. 4, at a value Va in the input voltage signal Vin, the highest gradient of the tangent to one of the non-linear output characteristic curves is greatly different from the lowest gradient of the tangent to an alternative one of the non-linear output characteristic curves.

Similarly, in FIG. 4, at a value Vb in the input voltage signal Vin, a range of the variations between the non-linear output characteristic curves of the TAD converter 28 is wide.

For this reason, in order to grasp accurate values of the input voltage signal Vin based on the output digital data D from each TAD converter 28, it is desired to obtain the relationship between the input voltage signal Vin in digital format and the output digital data D from each of the TAD converters 28. Particularly, the relationship between the input voltage signal Vin in digital format and the output digital data D from each of the individual TAD converters 28 is preferably devised to include the temperature dependence of a corresponding one of the individual TAD converters 28.

In order to achieve the requirements, the voltage monitoring system 1 is configured to cyclically generate and update a characteristic curve approximating a reference output characteristic curve of each TAD converter 28. The reference output characteristic curve illustrated by a solid line and reference character RC represents an actual output characteristic curve of a TAD converter 28, which will be referred to as TAD converter 28*a*1, at a predetermined reference temperature.

Figure 5:
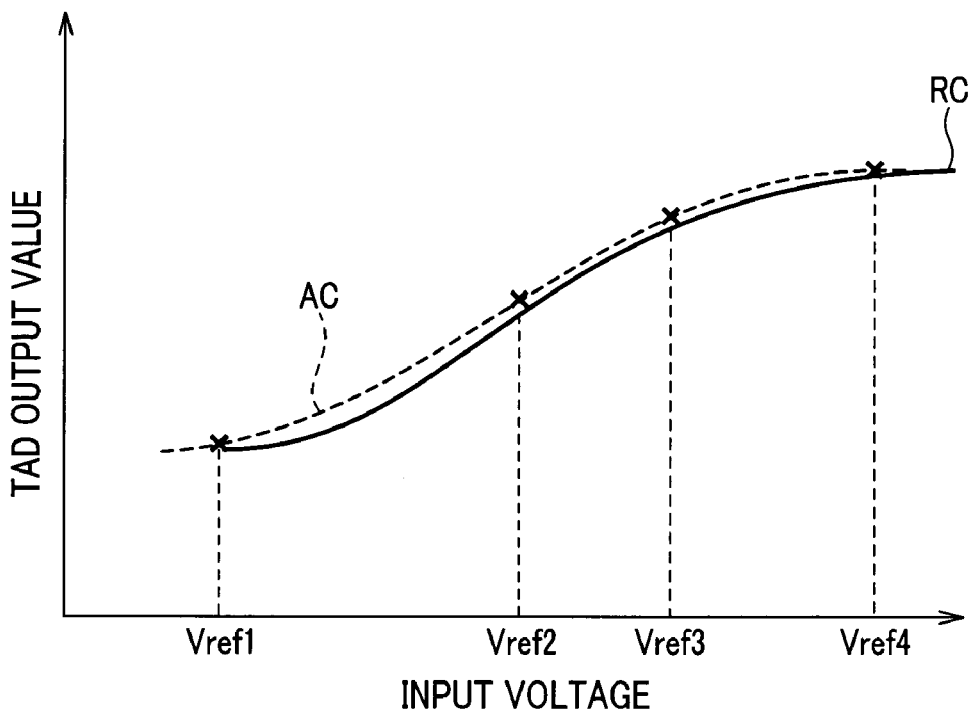
FIG. 5 is a graph schematically illustrating an approximating characteristic curve plotted by dashed lines and a reference characteristic curve of a TAD converter according to the first embodiment.

Specifically, in FIG. 5, an approximating characteristic curve, which is plotted by dashed lines and reference character AC, to the reference characteristic curve of the TAD converter 28*a*1 is generated based on:

a first value of the output digital data D from the TAD converter 28*a*1 upon a reference voltage value (level) Vref1 being inputted to the TAD converter 28*a*1;

a second value of the output digital data D from the TAD converter 28*a*1 upon a reference voltage value (level) Vref2 being inputted to the TAD converter 28*a*1;

a third value of the output digital data D from the TAD converter 28*a*1 upon a reference voltage value (level) Vref3 being inputted to the TAD converter 28*a*1; and a fourth value of the output digital data D from the TAD converter 28*a*1 upon a reference voltage value (level) Vref4 being inputted to the TAD converter 28*a*1.

In the first embodiment, as the approximating characteristic curve for each of the TAD converters 28, a cubic function curve is selected in D view of the fact that each of the output characteristic curves of the TAD converters 28 increases with increase in the variable of the input voltage signal Vin and has a number of inflection points.

Cubic function has four coefficient parameters. For this reason, the voltage monitoring system 1 is configured to determine an appropriate cubic function curve for each TAD converter 28 by:

specifying values of the four coefficient parameters based on four values of the output digital data D from a corresponding one TAD converter 28 upon corresponding four reference voltage values in the input voltage signal Vin being inputted to the corresponding one TAD converter 28.

As described above, the voltage monitoring system 1 is configured to:

cyclically generate and update the approximating characteristic curve for each of the TAD converters 28 based on actually inputted values of the input voltage signal Vin to a corresponding one of the TAD converters 28 and corresponding actually outputted values of the digital data D from the corresponding one of the TAD converters 28.

For this reason, the approximating characteristic curve for each of the TAD converters 28 can properly reflect the output digital data thereof at an actual temperature around a corresponding one of the TAD converters 28; this actual temperature fluctuates.

In addition, because the approximating characteristic curves are generated and updated for the respective individual TAD converters 28, they can reflect individual output-characteristic differences among the TAD converters 28.

More specifically, as described above, a monitoring unit Ui is equipped with four reference voltage units 32 provided for four adjacent cells B1, B2, B3, and B4, respectively.

Figure 6:
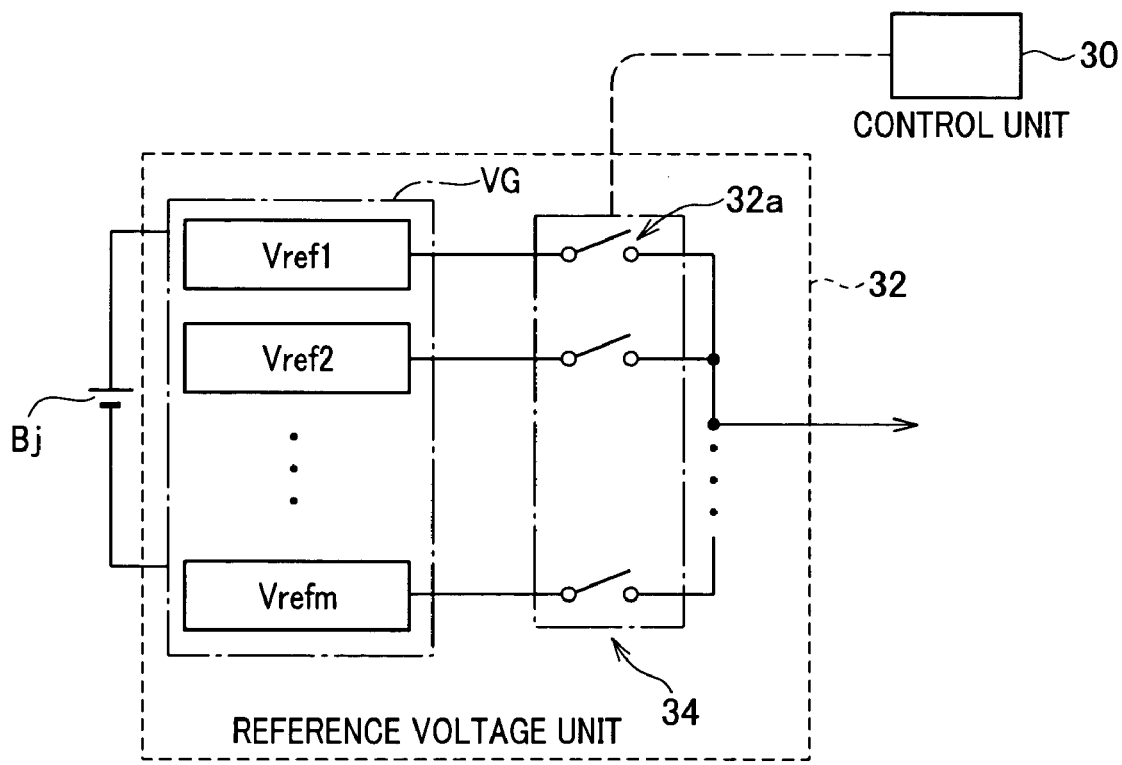
FIG. 6 is a circuit diagram schematically illustrating an example of the circuit structure of each of reference voltage units illustrated in FIG. 2.

FIG. 6 schematically illustrates an example of the circuit structure of each of the reference voltage units 32. Referring to FIG. 6, each of the reference voltage units 32 is provided with a voltage generator VG for generating a plurality of preset reference voltage values Vref1, Vref2, Vref3, . . . , Vrefm that are different from each other within a preset voltage range, and with a multiplexer 34. The multiplexer 34 includes a plurality of switches 32a the number of which is identical to the number (m) of the reference voltage values Vref1, Vref2, . . . , Vrefm.

The voltage generator VG of each of the reference voltage units 32 is electrically connected across a corresponding cell Bj. The voltage generator VG of each of the reference voltage units 32 works to generate the plurality of reference voltage values Vref1, Vref2, Vref3, . . . , Vrefm within the preset voltage range based on the voltage across a corresponding cell Bj by, for example, stepping down the voltage thereacross.

For example, the reference voltage values Vref1, Vref2, . . . , Vrefm are in order of increasing voltage value. That is, the upper limit of the preset voltage range is the reference voltage value Vrefm, and the lower limit thereof is the reference voltage Vref1.

In order to match the approximating characteristic curves with individual output-characteristic curves of the TAD converters 28 with high accuracy, it is desired to set the upper and lower limits of the plurality of reference voltages to the same level as a maximum level and that as a minimum level expected as the input voltage signal Vin, respectively.

Regarding this desire, note that the capacity of the battery pack 10 fluctuates. Thus, if the voltage across a cell Bj was directly applied to a corresponding TAD converter 28, stepping down of the voltage across the cell Bj would not generate a voltage with the same level as the maximum level expected as the input voltage signal Vin.

However, as illustrated in FIG. 2, the voltage monitoring system 1 is configured to divide the voltage across a cell Bj to thereby apply the divided value of the voltage across the cell Bj to the input terminal of a corresponding TAD converter 28.

This reduces the maximum level expected as the input voltage signal Vin to be inputted to each of the TAD converters 28. Thus, it is possible for each of the reference voltage units 32 to generate the upper limit of the plurality of reference voltages even if the voltage across each of the adjacent cells B1 to B4 fluctuates; this upper limit is the same as the maximum level expected as the input voltage signal Vin.

Note that, for the measuring process of the voltage across a cell Bj by a corresponding TAD 28, the temperature dependence of electronic elements to be used for the measuring process can be an issue. For example, temperature affects the resistances of the first and second resistors 20 and 22. This causes the calculation accuracy of the voltage across a cell Bj based on the output digital data D from a corresponding TAD converter 28 and the resistances R1 and R2 of corresponding first and second resistors 20 and 22 to depend on temperature. The reference voltages Vref1, Vref2, . . . , Vrefm to be generated by each of the reference voltage units 32 also depend on temperature.

The temperature dependence of the electronic elements to be used for the measuring process set forth above may cause the actual output voltage value from each reference voltage unit 32 to be deviated from a target one of the reference voltage values Vref1, Vref2, . . . , Vrefm. This may reduce the accuracy of matching between the approximating characteristic curves and the individual output-characteristic curves of each TAD converter 28.

In order to address the aforementioned issues, the voltage monitoring system 1 according to the first embodiment is designed to:

measure the temperature around each of the TAD converters 28 by using the temperature dependence of each of the TAD converters 28; and reduce or eliminate the temperature dependence of the measuring process of the voltage across each cell Bj.

Specifically, referring to FIG. 4, the values of the output digital data D from each TAD converter 28 with respect to the same value of the input voltage signal Vin vary depending on temperature.

For this reason, the voltage monitoring system 1 according to the first embodiment is configured to:

measure (estimate) the temperature around each TAD converter 28 when one of the reference voltages is inputted to each TAD converter 28; and reduce or eliminate the temperature dependence of each TAD converter 28 based on the measured temperature around a corresponding one of the TAD converters 28.

Figure 7:
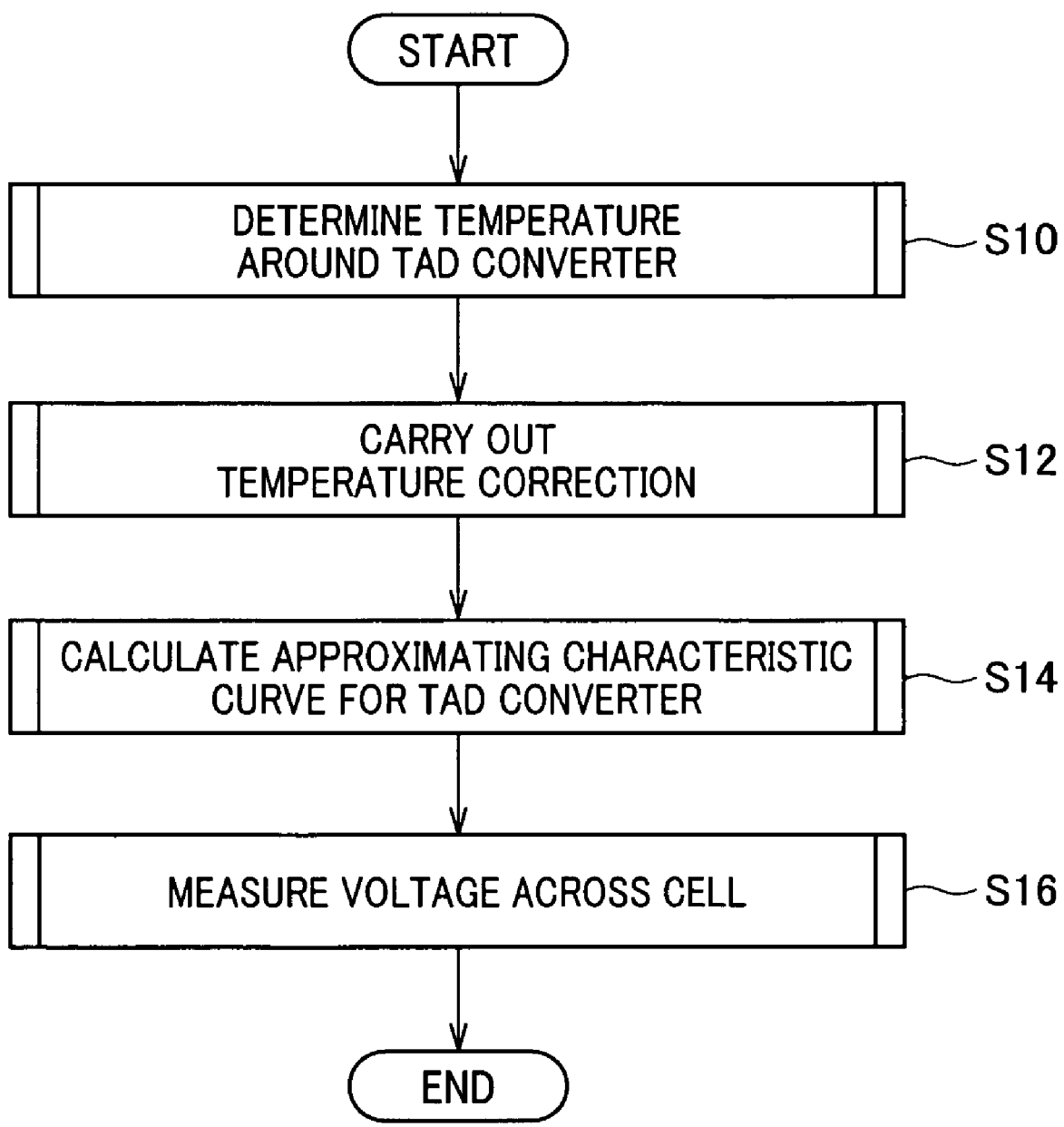
FIG. 7 is a flowchart schematically illustrating a voltage measuring routine for a cell with a process of reducing the temperature dependency of a corresponding one TAD converter according to the first embodiment.

FIG. 7 schematically illustrates a voltage measuring routine for a cell Bij with a process of reducing the temperature dependency of a corresponding one TAD converter 28. The voltage measuring routine is designed to be executed by the control unit 30 alone or by the control unit 30 in cooperation with the microcomputer 14 in accordance with a voltage measuring program. In the first embodiment, the control unit 30 is operative to singly carry out the voltage measuring routine.

The voltage measuring program is designed to be stored in, for example, the ROM and/or RAM of each of the control unit 30 and in the microcomputer 14. The voltage measuring program can be distributedly stored in the voltage monitoring system 1.

For example, the voltage measuring program is designed to be repeatedly executed by the control unit 30 at a preset cycle.

When starting the voltage measuring routine, the control unit 30 determines the temperature around each TAD converter 28 by using the temperature dependence of the output characteristic of a corresponding one of the TAD converters 28 in step S10.

Next, the control unit 30 calculates a correction for an actual output from each reference voltage unit 32 and a correction for each of the resistances R1 and R2 of the first and second resistors 20 and 22 based on the measured temperature around a corresponding one of the TAD converters 28 in step S12.

Thereafter, the control unit 30 calculates an approximating characteristic curve for each TAD converter 28 in step S14. The calculation in step S14 is carried out based on the output value of the digital data D from a corresponding one of the TAD converters 28. The output value of the digital data D from a corresponding one of the TAD converters 28 is generated upon each of corrected voltage values outputted from a corresponding one of the reference voltage units 32 being inputted to the corresponding one of the TAD converters 28.

Each of the reference voltage values Vref1 to Vrefm is corrected based on the calculated correction for a corresponding one of the reference voltage values Vref1 to Vrefm to thereby generate a corresponding one of the corrected voltage values to be inputted to each of the TAD converters 28.

Next, the control unit 30 grasps a proper divided voltage of the voltage across each cell Bij by the corresponding first and second resistors 20 and 22 based on the calculated correction for the corresponding first and second resistors 20 and 22 in step S16. Thus, in step S16, the control unit 30 measures (estimates) the voltage across each cell Bij based on the proper divided voltage corresponding to each cell Bij.

Figure 8:
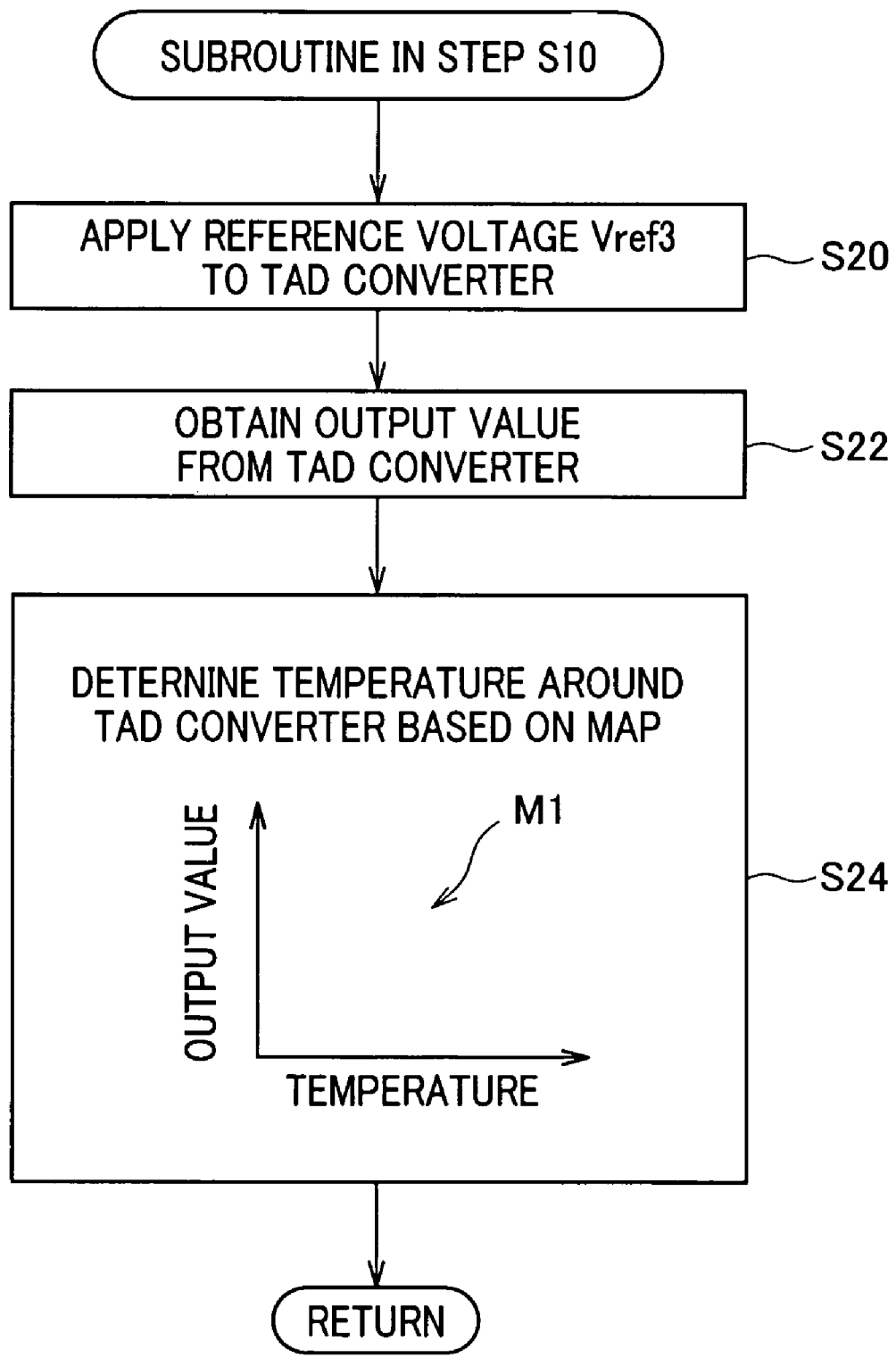
FIG. 8 is a flowchart schematically illustrating a subroutine of step S10 illustrated in voltage measuring routine according to the first embodiment.

Next, operations to be executed by the control unit 30 in the subroutine of step S10 will be fully described in accordance with FIG. 8.

In the subroutine of step S10, the control unit 30 controls each of the reference voltage units 32 and each of the selectors 24 to thereby apply, to a corresponding one of the TAD converters 28, one of the reference voltages Vref1 to Vrefm determined for temperature measurement in step S20.

For example, in the first embodiment, it is assumed that:

a range of the variations between the nonlinear output characteristic curves of each of the TAD converters 28 at the reference voltage value Vref3 is the widest in all ranges of the variations therebetween at the remaining reference voltages (see the value Vb in FIG. 4).

Thus, according to the assumption, the control unit 30 selects, as one voltage determined for temperature measurement, the reference voltage value Vref3 from all of the reference voltage values Vref1 to Vrefm, and applies it to each of the TAD converters 28 in step S20.

Thereafter, in step S22, the control unit 30 obtains the output value of the digital data D from each of the TAD converters 28.

Thus, in step S24, the control unit 30 determines the temperature around each of the TAD converters 28 based on the obtained output value of the digital data D and a corresponding one of maps M1.

Each of the maps M1 represents a relationship between a variable of the output of the digital data D from a corresponding one of the TAD converters 28 upon the reference voltage Vref3 being inputted thereto and a variable of the temperature around the corresponding one of the TAD converters 28. The maps M1 for the respective TAD converters 28 can be designed as data tables and stored in, for example, the ROM or RAM of the control unit 30, or designed as programs and embedded in the voltage monitoring program.

The maps M1 have been determined by, for example, many tests and/or simulations using the voltage monitoring system 1.

Specifically, in step S24, based on the obtained output value of the digital data D from each TAD converter 28, the control unit 30 references a corresponding one of the maps M1 to thereby determine a value of the temperature around a corresponding TAD converter 28 associated with the obtained output value of the digital data D in the corresponding one of the maps M1. After completion of the operation in step S24, the control unit 30 returns to the start point of the subroutine of step S12 in the voltage measuring routine.

Figure 9:
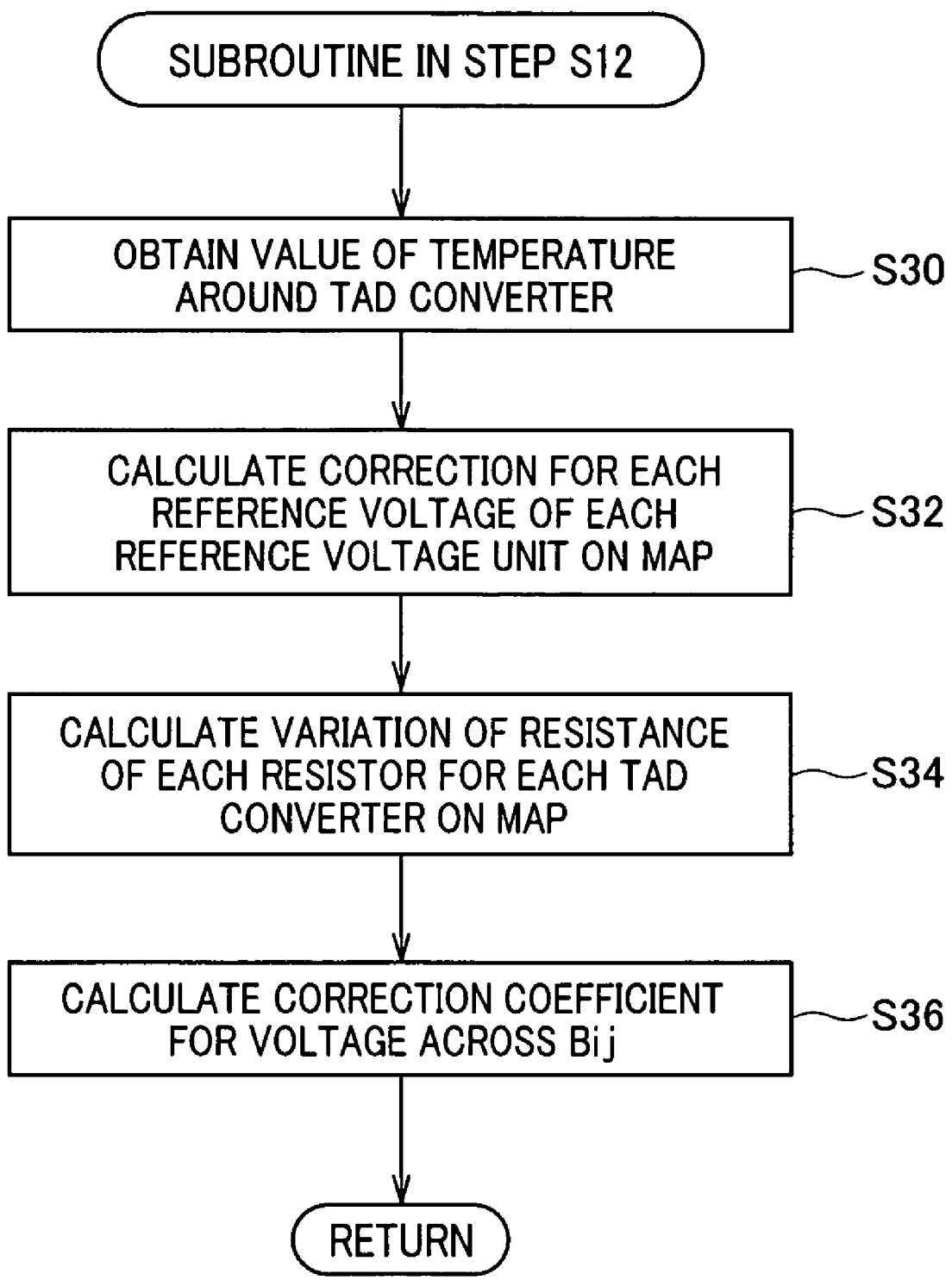
FIG. 9 is a flowchart schematically illustrating a subroutine of step S12 illustrated in voltage measuring routine according to the first embodiment.

Next, operations to be executed by the control unit 30 in the subroutine of step S12 will be fully described in accordance with FIG. 9.

In step S30 of the subroutine of step S12, the control unit 30 obtains the value of the temperature around each TAD converter 28 determined in the subroutine of step S10 (steps S20, S22, and S24).

Next, the control unit 30 calculates a correction for each of the reference voltage values Vref1, Vref2, . . . , Vrefm of each of the reference voltage units 32 based on the obtained value of the temperature around a corresponding one of the TAD converters 28 in step S32.

In other words, in step S32, the control unit 30 calculates a correction for an actual output value from each of the reference voltage units 32 when each of the reference voltage units 32 intends to output each of the reference voltage values Vref1, Vref2, . . . , Vrefm in step S32.

More specifically, the control unit 30 determines the correction for each of the reference voltage values Vref1, Vref2, . . . , Vrefm of each of the reference voltage units 32 based on the obtained value of the temperature around a corresponding one of the TAD converters 28 and a corresponding one of maps M2.

Each of the maps M2 represents a relationship between a variable of the correction for each of the reference voltages Vref1, Vref2, . . . , Vrefm of each reference voltage unit 32 and a variable of the temperature around a corresponding one of the reference voltage units 32. The temperature around each reference voltage unit 32 corresponds to the obtained temperature around a corresponding one of the TAD converters 28.

The maps M2 for the respective voltage reference units 32 can be designed as data tables and stored in, for example, the ROM or RAM of the control unit 30, or designed as programs and embedded in the voltage monitoring program.

The maps M2 have been determined by, for example, measuring the temperature dependence of the output characteristic of each reference voltage unit 32 before, for example, installation in each monitoring unit Ui or shipment of the voltage monitoring system 1.

Specifically, in step S32, based on the obtained value of the temperature around each TAD converter 28, the control unit 30 references a corresponding one of the maps M2 to thereby determine a value of the correction for each of the reference voltage values Vref1 to Vrefm; this determined value is associated with the obtained value of the temperature in the corresponding one of the maps M2.

Thereafter, in step S34, the control unit 30 calculates the variation of each of the resistances R1 and R2 of the first and second resistors 20 and 22 for each TAD converter 28 based on the obtained value of the temperature around a corresponding one of the TAD converters 28 and a corresponding one of maps M3.

Each of the maps M3 represents a relationship between a variable of the variation of each of the resistances R1 and R2 of the first and second resistors 20 and 22 for each TAD converter 28 and a variable of the temperature around a corresponding one pair of the first and second resistors 20 and 22. The temperature around each pair of the first and second resistors 20 and 22 corresponds to the obtained temperature around a corresponding one of the TAD converters 28.

The maps M3 for the respective pairs of the first and second resistors 20 and 22 can be designed as data tables and stored in, for example, the ROM or RAM of the control unit 30, or designed as programs and embedded in the voltage monitoring program.

The maps M3 have been determined by, for example, measuring the temperature dependence of the specific resistances R1 and R2 each pair of the first and second resistors 20 and 22 before, for example, installation in each monitoring unit Ui or shipment of the voltage monitoring system 1.

If the resistances R1 and R2 of each pair of the first and second resistors 20 and 22 proportionally increase with increase in temperature by their temperature coefficients of resistance, the map M3 for each pair of the first and second resistors 20 and 22 can be created from a relational expression with the temperature coefficient between the temperature and the resistance of a corresponding one pair of the first and second resistors 20 and 22.

Specifically, in step S34, based on the obtained value of the temperature around each TAD converter 28, the control unit 30 references a corresponding one of the maps M3 to thereby determine a value of the variation of each of the resistances R1 and R2 of the first and second resistors 20 and 22 for each TAD converter 28; this determined value is associated with the obtained value of the temperature in the corresponding one of the maps M3.

After completion of the operation in step S34, the control unit 30 calculates a correction coefficient K for the voltage across each cell Bij based on the determined value of the variation of each of the resistances R1 and R2 of the first and second resistances 20 and 22 for each TAD converter 28 in step S36.

Note that, at the predetermined reference temperature, a value of the correction coefficient K is set to 1.

For example, in step S36, the control unit 36 uses that the following relational equation is established:

$$V = V_{in} \cdot (R1+R2)/R2$$

where reference character V represents the voltage across each cell Bij.

Specifically, the control unit 30 calculates a value of the variation of the resistance ratio "(R1+R2)/R2" for the voltage across each cell Bij based on the determined value of the variation of each of the resistances R1 and R2 of the first and second resistors 20 and 22 for a corresponding one of the TAD converters 28 in step S36.

Based on the calculated value of the variation of the resistance ratio "(R1+R2)/R2" for the voltage across each cell Bij, the control unit 30 calculates the correction coefficient for the voltage across each cell Bij that compensates the calculated value of the variation of the resistance ratio "(R1+R2)/R2" for the voltage across a corresponding one cell Bij in step S36.

Figure 10:
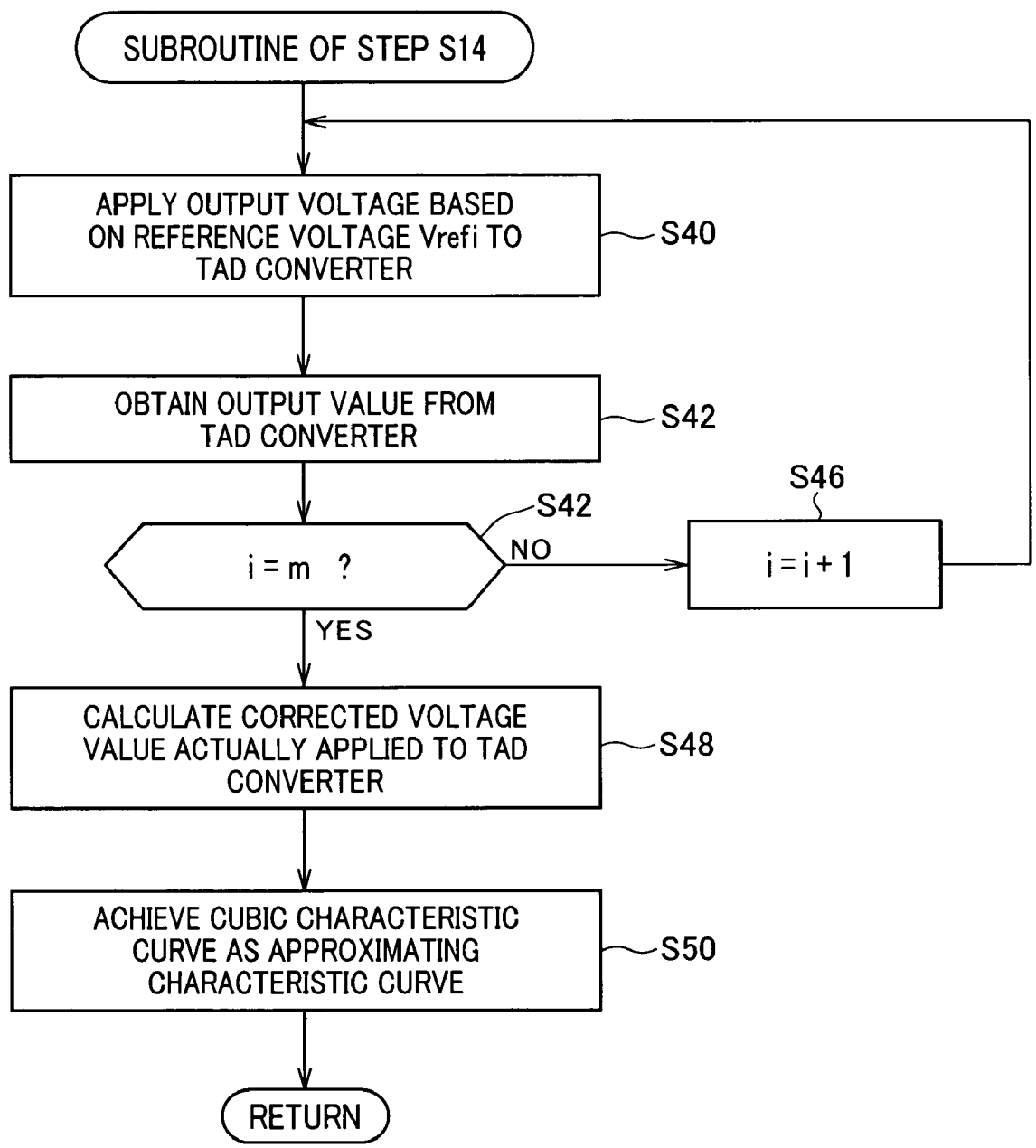
FIG. 10 is a flowchart schematically illustrating a subroutine of step S14 illustrated in voltage measuring routine according to the first embodiment.

Next, operations to be executed by the control unit 30 in the subroutine of step S14 will be fully described in accordance with FIG. 10.

In the subroutine of step S14, the control unit 30 controls each selector 24 to select the output voltage of a corresponding one reference voltage unit 32 based on a reference voltage value Vrefi (index i=1, 2, . . . , m) in step S40. This applies the output voltage of the corresponding one reference voltage unit 32 to the non-inverting input terminal of a corresponding one voltage follower 26 in step S40.

At the moment immediately after shifting to the subroutine of step S14 from that of step S12, the control unit 30 sets the index "i" to "1" to thereby select the reference voltage Vref1 as the reference voltage value Vrefi in step S40.

Next, the control unit 30 obtains the output value of the digital data D from each TAD converter 28 upon the reference voltage value Vrefi outputted from a corresponding one voltage follower 26 being inputted to each TAD converter 28 in step S42.

Subsequently, in step S44, the control unit 30 determines whether:

all of the reference voltage values Vref1 to Vrefm have been applied to each TAD converter 28 through a corresponding one voltage follower 26 (first condition); and the output voltages of the digital data D from each TAD converter 28 upon the respective voltage values Vref1 to Vrefm being inputted to each TAD converter 28 have been obtained (second condition).

When it is determined that at least one of the first and second conditions is not satisfied (the determination in step S44 is NO), the control unit 30 increments the index "i" by 1 to thereby select the reference voltage Vref2 as the reference voltage value Vrefi in step S46. Thereafter, the control unit 30 returns to step S40, and repeats the operations in steps S40 to S46. This allows the output values of the digital data D from each TAD converter 28 upon the reference voltage values Vref1, Vref2, . . . , outputted from a corresponding one voltage follower 26 being inputted to each TAD converter 28 to be sequentially obtained.

Thus, when the output value of the digital data D from each TAD converter 28 upon the reference voltage value Vrefm outputted from a corresponding one voltage follower 26 being inputted to each TAD converter 28 is obtained, the first and second conditions are satisfied (the determination in step S44 is YES).

Then, in step S48, the control unit 30 corrects each of the reference voltage values Vref1, Vref2, . . . , Vrefm to be inputted to each TAD converter 28 in step S40 based on the determined value of the correction for each of the reference voltage values Vref1 to Vrefm for each TAD converter 28 (see step S32 of FIG. 9).

Further, in step S48, the control unit 30 calculates, based on each of the corrected reference voltage values Vref1, Vref2, . . . , Vrefm, a corrected voltage value actually applied to each TAD converter 28 from a corresponding one reference voltage unit 32.

Next, the control unit 30 calculates, as an approximating characteristic curve, a cubic function curve with unspecified four coefficient parameters for each TAD converter 28 based on the corrected voltage values actually applied to a corresponding one TAD converter 28 and actual output values of the digital data D from each TAD converter 28 in step S50.

Specifically, in step S50, the control unit 30 calculates values of the unspecified four coefficient parameters to be contained in a cubic function curve for each TAD converter 28 based on the actually applied corrected voltage values to each TAD converter 28 and the actual output values of the digital data D therefrom. This achieves the cubic characteristic curve with the specified four coefficient parameters for each TAD converter 28 in step S50.

Figure 11:
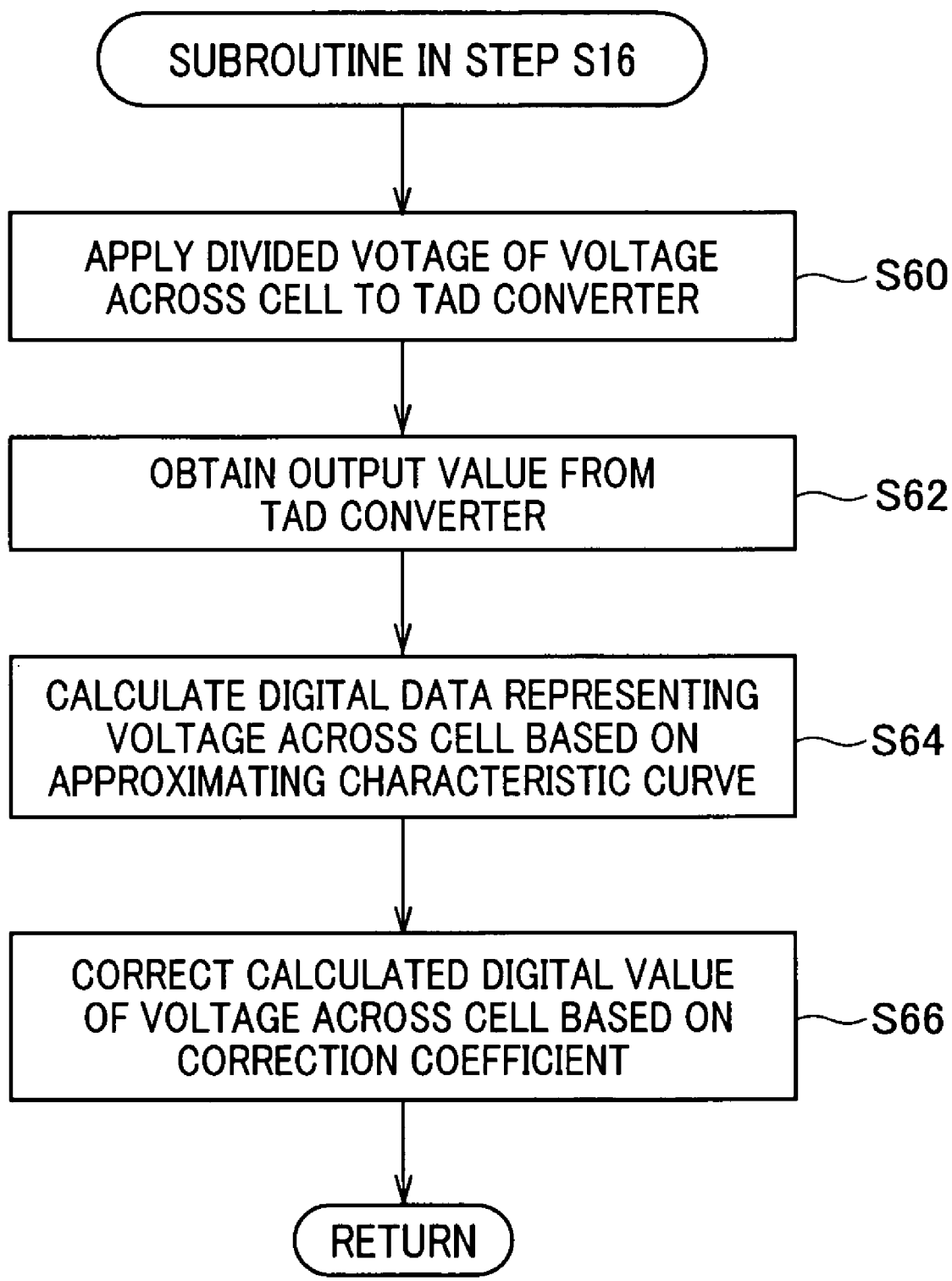
FIG. 11 is a flowchart schematically illustrating a subroutine of step S14 illustrated in voltage measuring routine according to the first embodiment.

Next, operations to be executed by the control unit 30 in the subroutine of step S16 will be fully described in accordance with FIG. 11.

In the subroutine of step S16, the control unit 30 controls each selector 24 to select the voltage at a corresponding output terminal T in step S60. This applies the divided value of the voltage across each cell Bij to the non-inverting input terminal of a corresponding one voltage follower 26 in step S60.

Next, the control unit 30 obtains the output value of the digital data D from each TAD converter 28 upon the divided value of the voltage across a corresponding Bij outputted from a corresponding one voltage follower 26 being inputted to each TAD converter 28 in step S62.

Subsequently, in step S64, the control unit 30 calculates digital data representing the voltage across each cell Bij based on a corresponding one of the cubic function curves as the approximating characteristic curves of the respective TAD converters 28.

Specifically, in step S64, the control unit 30 carries out processes (a) and (b):

the process (a) calculates a digital divided value of the voltage across each cell Bij by a corresponding pair of the first and second resistors 20 and 22 in a corresponding cubic function curve at the obtained output value of the digital data D from a corresponding one TAD converter 28 in step S62; and the process (b) calculates, from the digital divided value of the voltage across each cell Bij in the process (a), a digital value of the voltage across each cell Bij based on the resistances R1 and R2 of a corresponding pair of the first and second resistors 20 and 22 at the predetermined reference temperature.

Next, in step S66, the control unit 30 corrects the calculated digital value of the voltage across each cell Bij in the process (b) based on the correction coefficient K for the voltage across a corresponding one cell Bij calculated in step S36.

The finally achieved digital value of the voltage across each cell Bij is little or not affected by the temperature dependence of the actual output voltage from a corresponding one reference voltage unit 32 and that of the resistances R1 and R2 of a corresponding pair of the first and second resistors 20 and 22.

Note that the output voltage of each voltage follower 26 illustrated in FIG. 2 also van vary depending on temperature. However, the temperature dependence of each voltage follower 26 can be effective to both of the cases:

where the output voltage of a corresponding reference voltage unit 32 is applied to each voltage follower 26; and where the divided value of the voltage across a corresponding cell Bij is applied to each voltage follower.

For this reason, using the approximating characteristic curve for each TAD converter 28 calculated by the operation in step S14 allows the temperature dependence of the output voltage of a corresponding one voltage follower 26 to be compensated to a certain extent.

As fully described above, the voltage monitoring system 1 according to the first embodiment is configured to:

determine the temperature around each TAD converter 28 based on the output value of the digital data D from a corresponding one TAD converter 28 upon the voltage, such as the reference voltage value Vref3, determined for temperature measurement being inputted to the corresponding one TAD converter 28; and eliminate or reduce the temperature dependence of processes for measuring the voltage across each cell Bij by a corresponding one TAD converter 28 based on the determined temperature around the corresponding one TAD converter 28.

The configuration achieves the first effect of effectively preventing, due to variation in temperature, the reduction of the measurement accuracy of the voltage across each cell Bij with the use of the TAD converters 28.

The voltage monitoring system 1 is configured to:

apply, to each TAD converter 28, each reference voltage value Vrefi generated by a corresponding one reference voltage unit 32 to thereby obtain the output voltage of the digital data D from each TAD converter 28;

calculate a corrected voltage value actually applied to each TAD converter 28 from a corresponding one reference voltage unit 32 based on the obtained output voltage of the digital data D from a corresponding one TAD converter 28; and achieve a cubic characteristic curve for each TAD converter 28 based on the actually applied corrected voltage values to each TAD converter 28 and the actual output values of the digital data D therefrom.

The configuration achieves the second effect of reducing or eliminating the temperature dependence of the output voltage from each reference voltage unit 32, thus determining the cubic characteristic curve for each TAD converter 28 with high accuracy.

The voltage monitoring system 1 is configured to:

when measuring a value of the voltage across each cell Bij based on a divided value of the voltage across a corresponding one cell Bij as the input voltage signal Vin to a corresponding one TAD converter 28, compensate for the voltage-measurement error arising from temperature fluctuations in the resistance of a corresponding one pair of the first and second resistors 20 and 22.

The configuration achieves the third effect of monitoring the voltage across each cell Bij with high accuracy even if the resistance of a corresponding one pair of the first and second resistors 20 and 22 varies depending on temperature.

The voltage monitoring system 1 is configured to determine the temperature around each TAD converter 28 based on a corresponding one of maps M1 upon the voltage, such as the reference voltage value Vref3, determined for temperature measurement being inputted to a corresponding one TAD converter 28. Each of the maps M1 represents a variable of the output of the digital data D from a corresponding one TAD converter 28 upon the reference voltage Vref3 being inputted thereto and a variable of the temperature around the corresponding one TAD converter 28.

The configuration achieves the fourth effect of easily and properly determining the temperature around each TAD converter 28.

Second Embodiment

A voltage monitoring system 1A according to a second embodiment of the present invention will be described hereinafter with reference to FIG. 12.

The structure of the voltage monitoring system 1A according to the second embodiment is substantially identical to that of the voltage monitoring system 1 according to the first embodiment except for the following different points. So, like parts between the voltage monitoring systems according to the first and second embodiments, to which like reference characters are assigned, are omitted or simplified in description.

Figure 12:
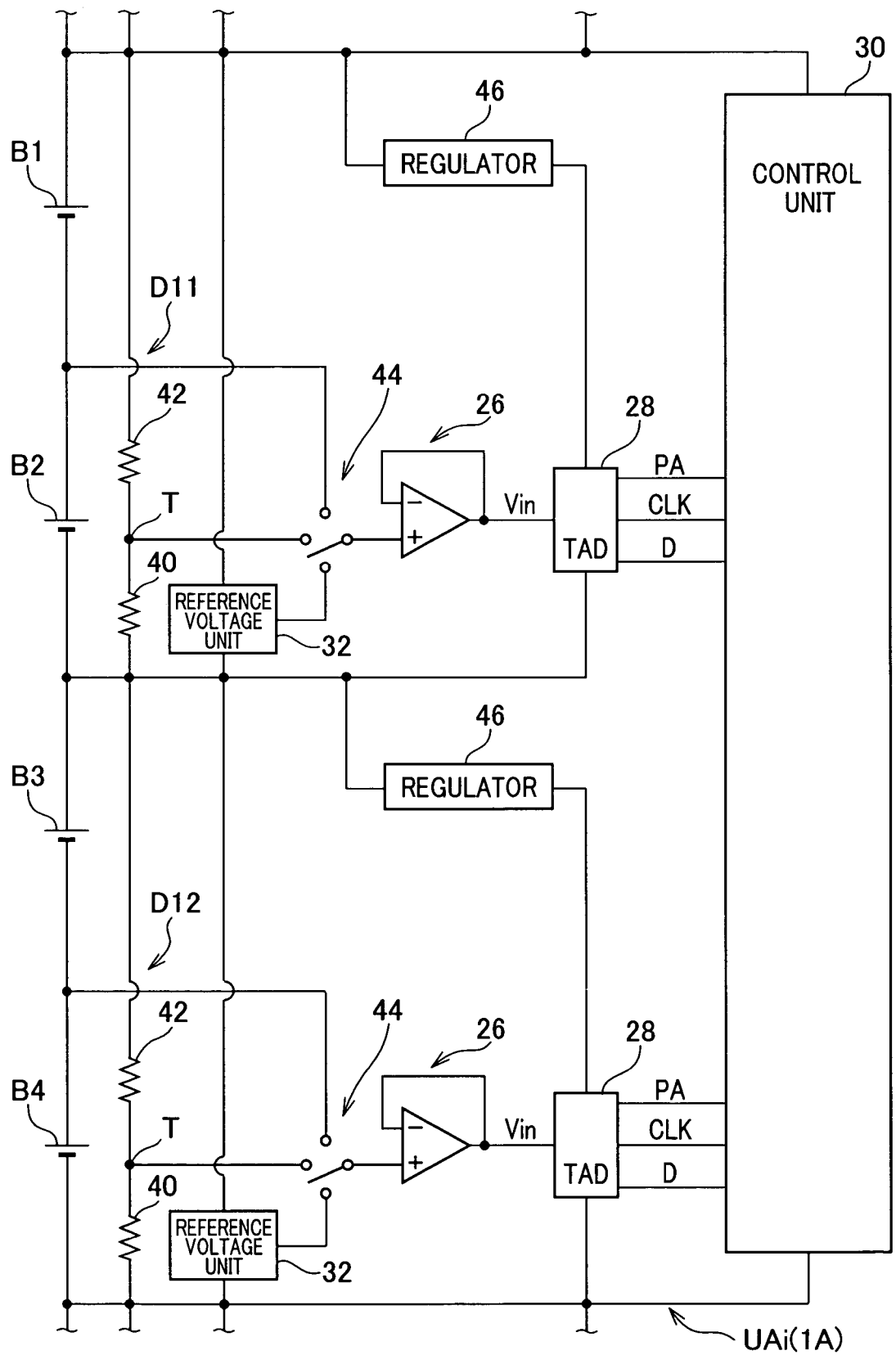
FIG. 12 is a circuit diagram schematically illustrating an example of the circuit structure of a monitoring unit of a voltage monitoring system according to a second embodiment of the present invention.

FIG. 12 schematically illustrates an example of the circuit structure of a monitoring unit UAi of the voltage monitoring system 1A.

Each monitoring unit UAi is provided with two voltage dividers D11 and D12 each consisting of a pair of first and second resistors 40 and 42 that are connected to each other in series through an output terminal T. The voltage divider D11 is electrically connected across a corresponding one pair of the cells B1 and B2, and the voltage divider D12 is electrically connected across a corresponding one pair of the cells B3 and B4.

The voltage divider D11 works to divide the sum of the voltage across the cell B1 and that across the cell B2, and the voltage divider D12 works to divide the sum of the voltage across the cell B3 and that across the cell B4

Each monitoring unit UAi is also provided with two selectors 44, two voltage followers 26, two time A/D converters (TAD converters) 28, a control unit 30, two reference voltage units 32, and two regulators 46.

The divided value of the voltage at the positive terminal of the cell B1 by the voltage divider D11 is outputted from the corresponding output terminal T to be inputted to one of the two selectors 44.

Similarly, the divided value of the voltage at the positive terminal of the cell B3 by the voltage divider D12 is outputted from the corresponding output terminal T to be inputted to the other of the two selectors 44.

Specifically, one of the selectors 44 is electrically connected to the output terminal T of one of the voltage dividers D11 and D12, and to the non-inverting input terminal of one of the voltage followers 26. The other of the selectors 44 is electrically connected to the output terminal T of the other of the voltage dividers D11 and D12, and to the non-inverting input terminal of the other of the voltage followers 26.

One of the selectors 44 is electrically connected to a connecting point between the negative terminal of the cell B1 and the positive terminal of the cell B2. The other of the selectors 44 is electrically connected to a connecting point between the negative terminal of the cell B3 and the positive terminal of the cell B4.

One of the selectors 44 is electrically connected to the output of one of the reference voltage units 32 and to the control unit 30. The other of the selectors 44 is electrically connected to the output of the other of the reference voltage units 32 and to the control unit 30.

Like the first embodiment, one of the reference voltage units 32 works to generate a plurality of reference voltage values within a preset voltage range based on the sum of the voltage across the cell B1 and that across the cell B2. The other of the reference voltage units 32 works to generate a plurality of reference voltage values within a preset voltage range based on the sum of the voltage across the cell B3 and that across the cell B4.

In order to measure the voltage across the cell B2, the control unit 30 controls one of the selectors 44 such that the voltage across the cell B2 is applied through one of the voltage followers 26 to one of the TAD converters 28. Similarly, in order to measure the voltage across the cell B4, the control unit 30 controls the other of the selectors 44 such that the voltage across the cell B4 is applied through the other of the voltage followers 26 to the other of the TAD converters 28.

In order to measure the voltage at the positive terminal of the cell B1, the control unit 30 controls one of the selectors 44 such that the divided value of the voltage at the positive terminal of the cell B1 is applied through one of the voltage followers 46 to one of the TAD converters 28. In order to measure the voltage at the positive terminal of the cell B3, the control unit 30 controls the other of the selectors 44 such that the divided value of the voltage at the positive terminal of the cell B3 is applied through the other of the voltage followers 46 to the other of the TAD converters 28.

In other words, one of the TAD converters 28 is shared for both the cells B1 and B2, the other thereof is shared for both the cells B3 and 84.

One of the regulators 46 works to:

regulate a voltage at the positive terminal of the high-side cell B1; and supply the regulated voltage to one of the TAD converters 28, thus operating it on the regulated voltage as a power supply voltage.

Similarly, the other of the regulators 46 works to:

regulate a voltage at the positive terminal of the high-side cell B3; and supply the regulated voltage to the other of the TAD converters 28, thus operating it on the regulated voltage as a power supply voltage.

Other operations of the voltage monitoring system 1A are substantially identical to those of the voltage monitoring system 1.

As described above, the voltage monitoring system 1A according to the second embodiment is configured such that:

one of the reference voltage units 32 operates on the sum of the voltage across the cell B1 and that across the cell B2; and the other of the reference voltage units 32 operates on the sum of the voltage across the cell B3 and that across the cell B4.

This achieves, in addition to the first to fourth effects, the fifth effect of appropriately expanding the preset voltage range of the plurality of reference voltage values that each of the reference voltage units 32 can generate.

The voltage monitoring system 1A is configured to:

when measuring the high-side voltage at the positive terminal of the cell B1 or B3, divide the voltage at the positive terminal of the cell B1 or B3.

This achieves, in addition to the first to fifth effects, the sixth effect of limiting a voltage range expected as the input voltage signal Vin.

Third Embodiment

A voltage monitoring system 1B according to a third embodiment of the present invention will be described hereinafter with reference to FIG. 13.

The structure of the voltage monitoring system 1B according to the third embodiment is substantially identical to that of the voltage monitoring system 1 according to the first embodiment except for the following different points. So, like parts between the voltage monitoring systems according to the first and third embodiments, to which like reference characters are assigned, are omitted or simplified in description.

Figure 13:
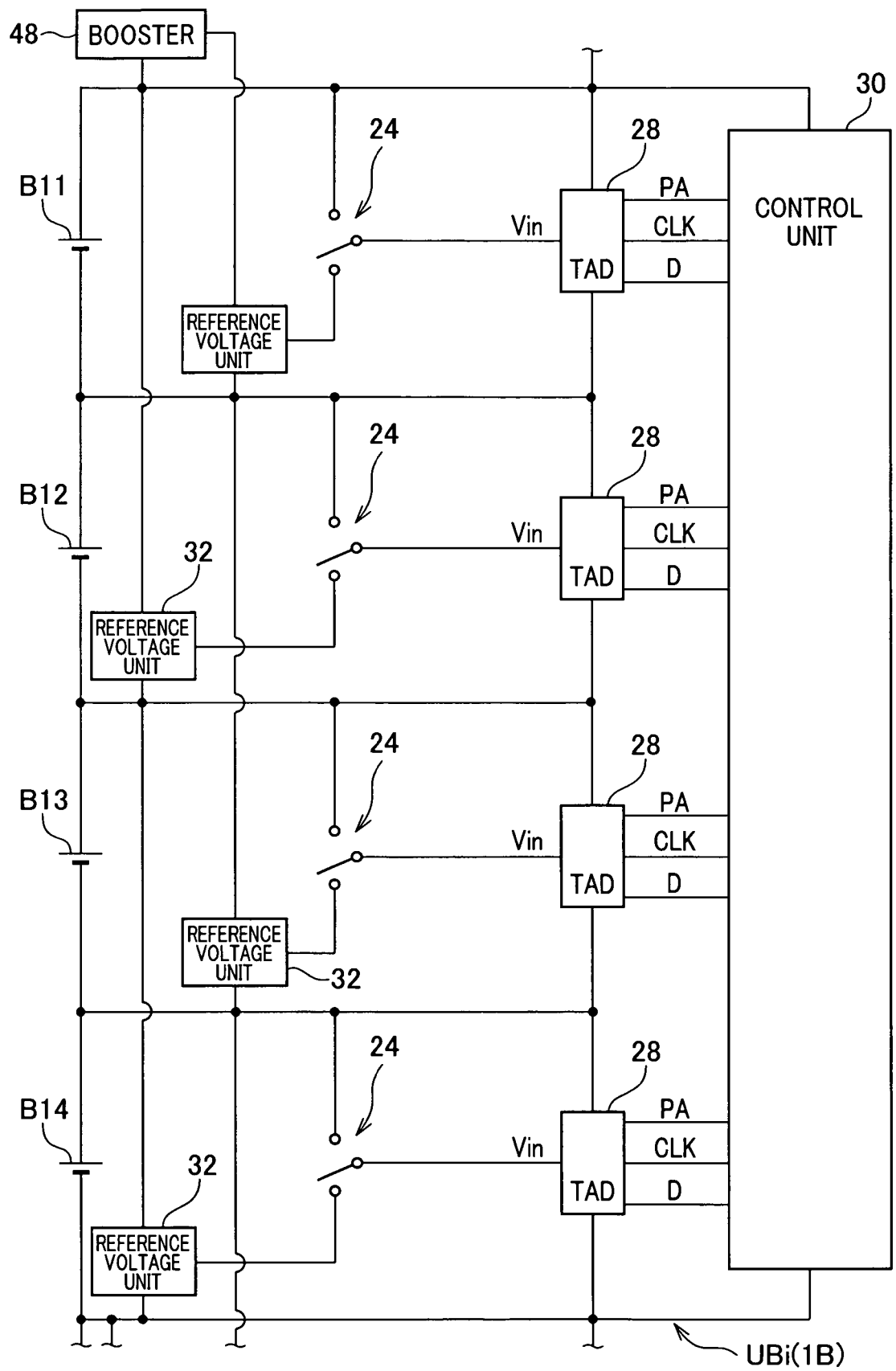
FIG. 13 is a circuit diagram schematically illustrating an example of the circuit structure of a monitoring unit of a voltage monitoring system according to a third embodiment of the present invention.

FIG. 13 schematically illustrates an example of the circuit structure of a monitoring unit UBi of the voltage monitoring system 1B.

Each monitoring unit UBi is provided with a booster 48 electrically connected to each of the reference voltage units 32. The booster 48 works to boost the voltage across the cell B11.

One of the reference voltage units 32, which corresponds to the highest potential cell B11, is configured to operate on the voltage boosted by the booster 48 as its power supply voltage to thereby generate a plurality of reference voltage values within a preset voltage range.

Each of the remaining reference voltage units 32, which corresponds to a cell Bij, is configured to operate on the sum of the voltage across a corresponding cell Bij and a high-potential side cell Bij-1 adjacent thereto as its power supply voltage to thereby generate a plurality of reference voltage values within a preset voltage range.

For example, the reference voltage unit 32, which corresponds to the cell B12, is configured to operate on the sum of the voltage across the cell B12 and that across the high-potential side cell B11 adjacent thereto. Similarly, the reference voltage unit 32, which corresponds to the cell B14, is configured to operate on the sum of the voltage across the corresponding cell B14 and that across the high-potential side cell B13 adjacent thereto.

The configuration set forth above expands a preset voltage range of a plurality of reference voltages to be generated by each of the reference voltage units 32 corresponding to a cell Bij such that the expanded preset voltage range includes an upper limit and a lower limit that are expected as the voltage across a cell Bij.

For this reason, it is possible to determine an approximating characteristic curve for each TAD converter 28 with higher accuracy within a voltage range defined by the upper limit and the lower limit expected as the voltage across a corresponding cell Bij. This advantage allows a TAD converter 28 for each cell Bij to directly receive the voltage across each cell Bij with the measurement accuracy of the voltage thereacross being kept high.

This can eliminate the plurality of pairs of first and second resistors 20 and 22, and the plurality of voltage followers 26, thus eliminating processes for compensating for the fluctuations of the resistances of each pair of the first and second resistors 20 and 22. In addition, even if the amount of fluctuations of each voltage follower 26 varied depending on an input voltage, it would measure the voltage across each cell Bij without influence from the variations of the amount of fluctuations of each voltage follower 26.

Other operations of the voltage monitoring system 1B are substantially identical to those of the voltage monitoring system 1.

As described above, the voltage monitoring system 1B according to the third embodiment is configured such that:

one of the reference voltage units 32, which corresponds to the highest potential cell B11, operates on the voltage boosted by the booster 48 as its power supply voltage to thereby generate a plurality of reference voltage values within a preset voltage range; and each of the remaining reference voltage units 32, which corresponds to a cell Bij, operates on the sum of the voltages across respective adjacent cells as its power supply voltage to thereby generate a plurality of reference voltage values within a preset voltage range.

That is, a reference voltage value to be applied to the TAD converter 28 for the highest-potential cell B11 as the upper limit of the input voltage signal Vin may be required to be higher than the voltage across the highest-potential cell B11. In this case, division of the voltage across the highest-potential cell B11 may not generate the reference voltage value.

However, the configuration set forth above reliably generates the reference voltage value to be applied to the TAD converter 28 higher than the voltage across the highest-potential cell B11. This makes it possible to accommodate the upper and lower limits expected as the voltage across a cell Bij in a preset voltage range of a plurality of reference voltages to be generated by each of the reference voltage units 32.

This achieves, in addition to the first, second, and fourth effects, the seventh effect of allowing an approximating characteristic curve for each TAD converter 28 to have higher accuracy within a voltage range defined by the upper limit and the lower limit expected as the voltage across a corresponding cell Bij. This allows a TAD converter 28 for each cell Bij to directly receive the voltage across each cell Bij with the measurement accuracy of the voltage thereacross being kept high. This advantage reduces the number of electronic components that affect the accuracy of measuring the voltage across each cell Bij.

Fourth Embodiment

A voltage monitoring system 1C according to a fourth embodiment of the present invention will be described hereinafter with reference to FIG. 14.

The structure of the voltage monitoring system 1C according to the fourth embodiment is substantially identical to that of the voltage monitoring system 1 according to the first embodiment except for the following different points. So, like parts between the voltage monitoring systems according to the first and fourth embodiments, to which like reference characters are assigned, are omitted or simplified in description.

Figure 14:
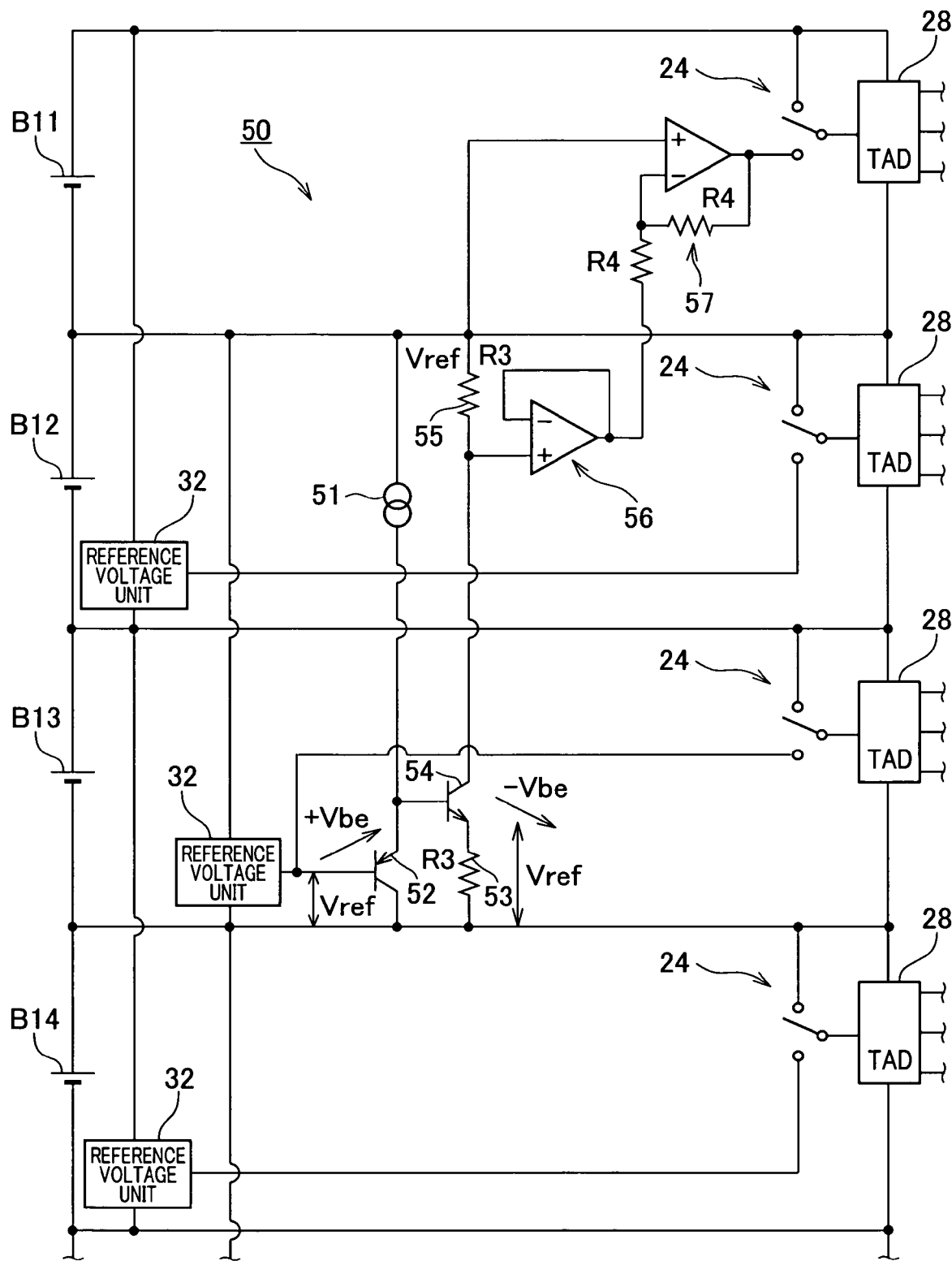
FIG. 14 is a circuit diagram schematically illustrating an example of the circuit structure of a monitoring unit of a voltage monitoring system according to a fourth embodiment of the present invention.

FIG. 14 schematically illustrates an example of the circuit structure of a monitoring unit UCi of the voltage monitoring system 1C.

In each monitoring unit UCi, the reference voltage units 32 are provided for respective cells Bij except for the highest potential cell B11.

Each of the remaining reference voltage units 32, which corresponds to a cell Bij except for the highest potential cell B11, is configured to operate on the sum of the voltage across a corresponding cell Bij and that a high-potential side cell across Bij-1 adjacent thereto as its power supply voltage to thereby generate a plurality of reference voltage values within a preset voltage range.

For the highest potential cell B11, a level shift circuit 50 is provided in place of a corresponding reference voltage unit 32. The level shift circuit 50 works to apply an output value of the reference voltage unit 32 for the cell B13 to the input terminal of the TAD converter 28 for the highest potential cell B11.

Specifically, the level shift circuit 50 includes a constant current source 51, a bipolar transistor 52, a resistor 53, a bipolar transistor 54, a resistor 55, a voltage follower 56, and an inverting amplifier 57.

The reference voltage unit 32 for the cell B13 is designed with the negative terminal of the cell B13 as a reference potential. The output terminal of the reference voltage unit 32 for the cell B13 is electrically connected to the base of the bipolar transistor 52. The collector of the bipolar transistor 52 is electrically connected to the negative terminal of the cell B13, and the emitter thereof is electrically connected to the constant current source 51 operating on the cell B12 as its power supply.

Between the constant current source 51 and the emitter of the bipolar transistor 52, the base of the bipolar transistor 54 is electrically connected. The emitter of the bipolar transistor 54 is electrically connected to the negative terminal of the cell B13 via the resistor 53 with a resistance R3, and the collector thereof is electrically connected to the positive terminal of the cell B12 via the resistor 55 whose resistance is equal to the resistance R3 of the resistor 53.

The collector voltage of the bipolar transistor 54 is configured to be applied, via the voltage follower 56, to an inverting input terminal of an operational amplifier constituting the inverting amplifier 57. A non-inverting input terminal of the operational amplifier 57 is electrically connected to the negative terminal of the cell B11. The inverting amplifier 57 is configured such that a resistance of a resistor connecting its output terminal and inverting input terminal and a resistance of a resistor connecting an output terminal of the voltage follower 56 and the inverting terminal of the inverting amplifier 57 are commonly set as a same resistance R4. This results in that an absolute value of a voltage to be inputted to the inverting input terminal of the inverting amplifier 57 is equal to that of a voltage to be outputted from the output terminal thereof.

The amount of current flowing from the constant current source 51 is set to the amount of a collector current of the bipolar transistor 52 in a linear region within which the collector current increases in proportion to a voltage Vbe between the base and the emitter of the bipolar transistor 52.

In addition, the resistance R3 of the resistor 54 is adjusted such that a collector current of the bipolar transistor 54 is equal to the current flowing from the constant current source 51

This allows a voltage between the base and emitter of the bipolar transistor 54 to be set to the sum of a reference voltage value Vrefi outputted from the reference voltage unit 32 for the battery B13 and the voltage Vbe between the base and emitter of the bipolar transistor 52.

When the characteristics of the bipolar transistor 52 and those of the bipolar transistor 54 are the same as each other, the voltage between the base and emitter of the bipolar transistor 54 is identical to that the voltage Vbe between the base and emitter of the bipolar transistor 52.

This allows a reference voltage value Vrefi outputted from the reference voltage unit 32 for the battery B13 to develop across the resistor 53.

Because the same current flows in both the resistor 53 and the resistor 55 and the resistances of them are equal to each other, a reference voltage value Vrefi outputted from the reference voltage unit 32 for the battery B13 develops across the resistor 55.

Because a low-potential end of the resistor 55 is electrically connected to the non-inverting input terminal of the voltage follower 56, the output voltage from the voltage follower 56 is set to a reference voltage value Vrefi whose sign is reversed.

This allows an output voltage from the inverting amplifier 57 to be set to a reference voltage value Vrefi outputted from the reference voltage unit 32 for the battery B13.

The configuration of the voltage shift circuit 50 allows a reference voltage value Vrefi generated by the reference voltage unit 32 for the battery B13 to be properly applied to the TAD converter 28 for measuring the voltage across the highest-potential cell B11. This determines an approximating characteristic curve for the TAD converter 28 for the highest-potential cell B11 with high accuracy within a voltage range defined by the upper limit and the lower limit expected as the voltage across a corresponding cell Bij. This advantage allows a TAD converter 28 for each cell Bij to directly receive the voltage across each cell Bij with the measurement accuracy of the voltage thereacross being kept high.

This can eliminate the plurality of pairs of first and second resistors 20 and 22, and the plurality of voltage followers 26, thus eliminating processes for compensating for the fluctuations of the resistances of each pair of the first and second resistors 20 and 22. In addition, even if the amount of fluctuations of each voltage follower 26 varied depending on an input voltage, it would measure the voltage across each cell Bij without influence from the variations of the amount of fluctuations of each voltage follower 26.

Note that, when the level shift circuit 50 has a temperature dependence, a voltage to be actually applied by the level shift circuit 50 to the TAD converter 28 for measuring the voltage across the highest potential cell B11 may be deviated from a reference voltage value Vrefi generated by the reference voltage unit 32 for the cell B13.

In the fourth embodiment, even if the voltage across the highest potential cell B11 was deviated from a reference voltage value Vrefi generated by the reference voltage unit 32 for the cell B13, the voltage monitoring system 1C would compensate for the voltage-measurement error arising from temperature fluctuations in the characteristics of the level shift circuit 50. This compensation can be carried out in the same manner as compensation for the voltage-measurement error arising from temperature fluctuations in the resistance of a corresponding one pair of the first and second resistors 20 and 22.

Operations of the voltage monitoring system 1C are substantially identical to those of the voltage monitoring system 1.

As described above, the voltage monitoring system 1C according to the fourth embodiment is configured such that:

each of the reference voltage units 32, which corresponds to a cell Bij except for the highest potential cell B11, operates on the sum of the voltages across respective adjacent cells as its power supply voltage to thereby generate a plurality of reference voltage values within a preset voltage range; and the level shift circuit 50 shifts a reference voltage value Vrefi to be generated by one of the reference voltage units 32 to be applied to the TAD converter 28 for the highest potential cell B11.

That is, a reference voltage value to be applied to the TAD converter 28 for the highest-potential cell B11 as the upper limit of the input voltage signal Vin may be required to be higher than the voltage across the highest-potential cell B11. In this case, division of the voltage across the highest-potential cell B11 may not generate the reference voltage value.

However, even if a reference voltage value to be applied to the TAD converter 28 may be required to be higher than the voltage across the highest-potential cell B11, the reference voltage value is set within a voltage range that can be generated by one reference voltage unit 32 operating on a plurality of voltages of a plurality of cells.

For this reason, the configuration set forth above reliably generates the reference voltage value to be applied to the TAD converter 28 higher than the voltage across the highest-potential cell B11 based on the sum of the voltages across respective adjacent cells.

This makes it possible to accommodate the upper and lower limits expected as the voltage across a cell Bij in a preset voltage range of a plurality of reference voltages to be generated by each of the reference voltage units 32.

This achieves, in addition to the first, second, and fourth effects, the eighth effect of allowing an approximating characteristic curve for each TAD converter 28 to have higher accuracy within a voltage range defined by the upper limit and the lower limit expected as the voltage across a corresponding cell Bij. This allows a TAD converter 28 for each cell Bij to directly receive the voltage across each cell Bij with the measurement accuracy of the voltage thereacross being kept high.

Fifth Embodiment

A voltage monitoring system 1D according to a fifth embodiment of the present invention will be described hereinafter with reference to FIG. 15.

The structure of the voltage monitoring system 1D according to the fifth embodiment is substantially identical to that of the voltage monitoring system 1 according to the first embodiment except for the following different points. So, like parts between the voltage monitoring systems according to the first and fifth embodiments, to which like reference characters are assigned, are omitted or simplified in description.

Figure 15:
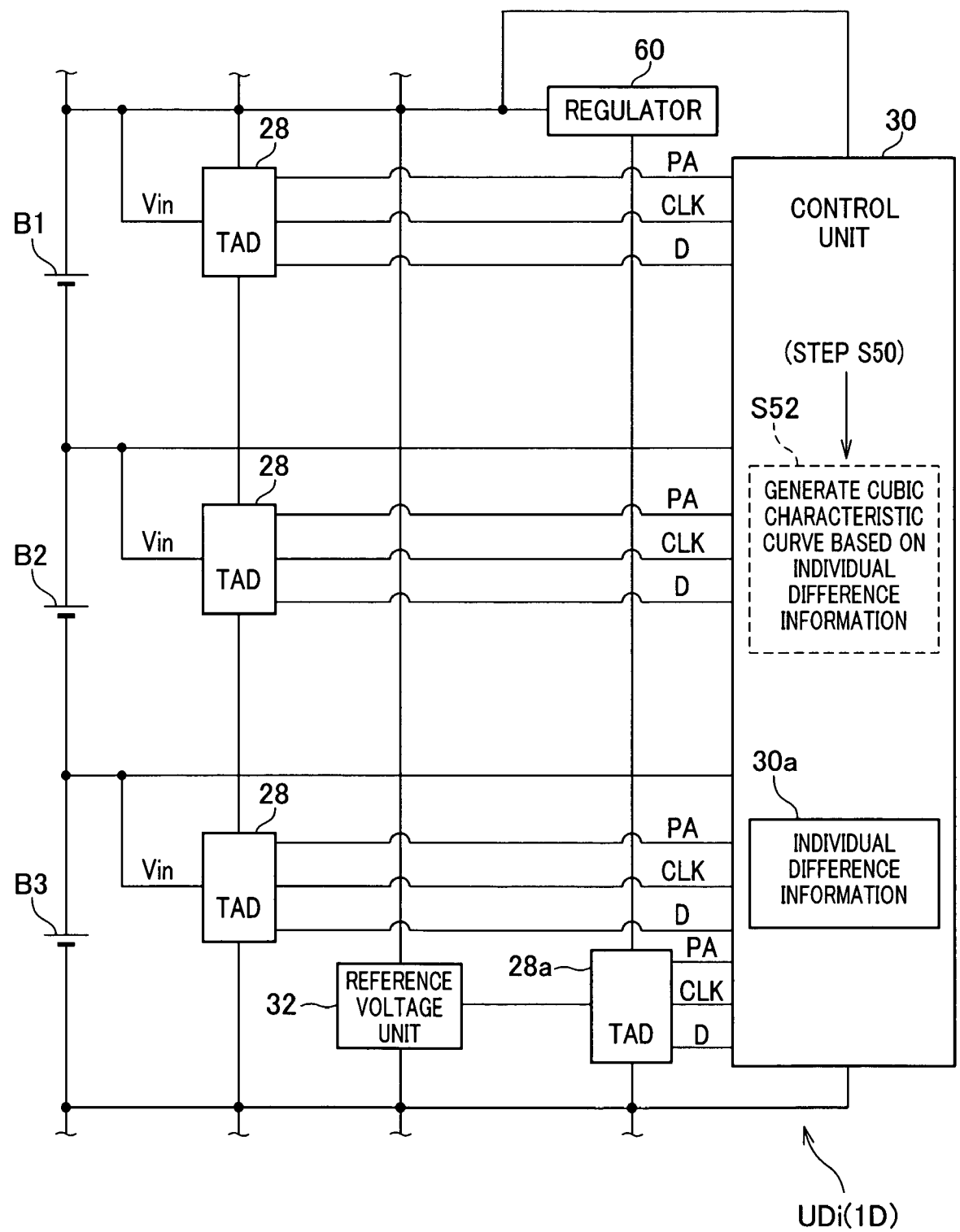
FIG. 15 is a circuit diagram schematically illustrating an example of the circuit structure of a monitoring unit of a voltage monitoring system according to a fifth embodiment of the present invention.

FIG. 15 schematically illustrates an example of the circuit structure of a monitoring unit UDi of the voltage monitoring system 1D.

Each monitoring unit UDi includes a regulator 60, and works to monitor the voltage across each of the cells B1, B2, and B3.

Each of the TAD converters 28 provided for a corresponding one of the cells B1 to B3 works to directly receive the voltage across a corresponding one of the cells B1 to B3 as the input voltage signal Vin.

Each monitoring unit UDi is provided with a reference TAD converter 28r for calculating an approximating characteristic curve for each TAD converter 28. The reference voltage unit 32 is provided for the reference TAD converter 28r.

The reference voltage unit 32 is configured to operate on the sum of the voltages across respective cells B1, B2, and B3 as its power supply voltage, and to generate a plurality of reference voltages within a wide range including the upper limit and lower limit of the voltage across each cell Bij.

To an input terminal of the reference TAD converter 28r, the plurality of reference voltage values are configured to be applied. The reference TAD converter 28r is configured to operate on an output voltage of the regulator 60 electrically connected to the positive electrode of the cell B1.

In the configuration of the voltage monitoring system 1D, like the first embodiment, the control unit 30 is programmed to cyclically determine a cubic characteristic curve as an approximating characteristic curve for the reference TAD converter 28r based on an output value of the reference TAD converter 28r upon the plurality of reference voltage values being applied thereto. The approximating characteristic curve approximates the output characteristic of the reference TAD converter 28r at an actual temperature with high accuracy.

Specifically, the control unit 30 carries out the operations in steps S40 to S50 of the subroutine in step S14 for the reference TAD converter 28r. This achieves the cubic characteristic curve for the reference TAD converter 28a (see step S50).

Next, the control unit 30 is programmed to generate, as an approximating curve, a cubic characteristic curve for each TAD converter 28 prepared for a corresponding one of the cell B1 to B3 based on the created cubic characteristic curve for the reference TAD converter 28r and individual difference information 30a (see step S52 in FIG. 15).

The individual difference information represents individual differences between the output characteristic of each of the TAD converters 28 and that of the TAD converter 28r.

Specifically, the individual difference information represents quantitative deviations of a variable of the output value of each of the TAD converter 28 from a variable of the output value of the reference TAD converter 28r upon the plurality of reference voltage values being applied to each of the TAD converter 28 and the reference TAD converter 28r. The individual difference information can be designed as data tables and stored in, for example, the ROM or RAM of the control unit 30, or designed as programs and embedded in the voltage monitoring program. The individual difference information has been determined by, for example, many tests and/or simulations using the voltage monitoring system 1D.

Specifically, in step S52, the control unit 30 corrects the cubic characteristic curve for the reference TAD converter 28r based on the individual difference information 30a. This generates a cubic characteristic curve for each of the reference TAD converters 28r so as to compensate the quantitative deviations of the variable of the output value of each of the TAD converter 28 from the variable of the output value of the reference TAD converter 28r.

Other operations of the voltage monitoring system 1D are substantially identical to those of the voltage monitoring system 1.

As described above, the voltage monitoring system 1D according to the fifth embodiment is configured to provide the plurality of TAD converters 28 each for directly capturing the voltage across a corresponding cell Bij and the reference TAD converter 28r for creating an approximating characteristic curve of the output characteristic of each TAD converter 28. The voltage monitoring system 1D is also configured such that the reference voltage unit 32 for applying the plurality of reference voltage values to the reference TAD converter 28r operates on the sum of the voltages across respective cells B1 to B3 as its power supply voltage.

Thus, the reference voltage unit 32 for the reference TAD converter 28r reliably generates the reference voltage value to be applied to the TAD converter 28r higher than the voltage across the highest-potential cell B1 based on the sum of the voltages across respective cells B1 to B3 as the power supply voltage of the reference.

This makes it possible to accommodate the upper and lower limits expected as the voltage across a cell Bij in a preset voltage range of a plurality of reference voltages to be generated by each of the reference voltage units 32.

This achieves, in addition to the first, second, and fourth effects, the ninth effect of allowing an approximating characteristic curve for each TAD converter 28 based on an approximating characteristic curve for the reference TAD converter 28r to have higher accuracy within a voltage range. The voltage range is defined by the upper limit and the lower limit expected as the voltage across a corresponding cell Bij.

This allows a TAD converter 28 for each cell Bij to directly fetch the voltage across each cell Bij with the measurement accuracy of the voltage thereacross being kept high.

This can eliminate the plurality of pairs of first and second resistors 20 and 22, and the plurality of voltage followers 26, thus eliminating processes for compensating for the fluctuations of the resistances of each pair of the first and second resistors 20 and 22. In addition, even if the amount of fluctuations of each voltage follower 26 varied depending on an input voltage, it would measure the voltage across each cell Bij without influence from the variations of the amount of fluctuations of each voltage follower 26.

Moreover, in addition to the first, second, fourth, and ninth effects, the, the tenth effect of approximating, with high accuracy, the output characteristic of each of the TAD converter 28 with based on the approximating characteristic curve for the reference TAD converter 28r.

Sixth Embodiment

A voltage monitoring system 1E according to a sixth embodiment of the present invention will be described hereinafter with reference to FIG. 16.

The structure of the voltage monitoring system 1E according to the sixth embodiment is substantially identical to that of the voltage monitoring system 1 according to the first embodiment except for the following different points. So, like parts between the voltage monitoring systems according to the first and sixth embodiments, to which like reference characters are assigned, are omitted or simplified in description.

Figure 16:
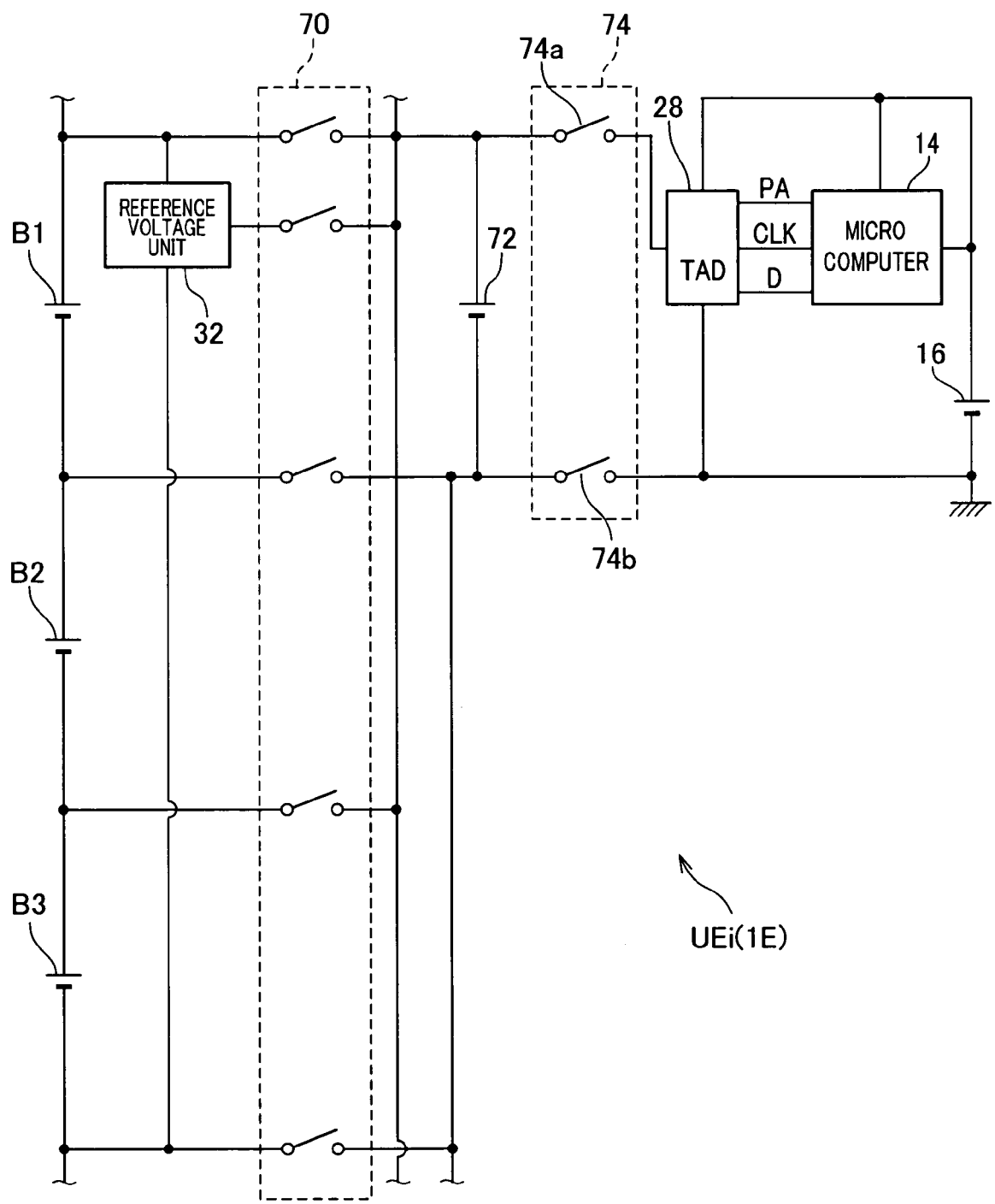
FIG. 16 is a circuit diagram schematically illustrating an example of the circuit structure of a monitoring unit of a voltage monitoring system according to a sixth embodiment of the present invention.

FIG. 16 schematically illustrates an example of the circuit structure of a monitoring unit UEi of the voltage monitoring system 1E.

Each monitoring unit UEi is provided with a multiplexer 70, a flying capacitor 72, and a switch member 74. Each monitoring unit UEi is operative to monitor the voltage across each of the cells B1, B2, and B3 with the use of one TAD converter 28 and one reference voltage unit 32.

The positive power supply terminal and ground terminal of the TAD converter 28 are electrically connected to the positive terminal and negative terminal of the low voltage battery 16. This allows the TAD converter 28 to operate on a voltage across the low voltage battery 16 as its power supply voltage.

The multiplexer 70 is electrically connected across each cell Bij.

The TAD converter 28 is electrically connected at its input terminal to a first switch 74a of the switch member 74, and the first switch 74a is electrically connected to one electrode of the flying capacitor 72. The TAD converter 28 is electrically connected at its ground terminal to a second switch 74a of the switch member 74, and the second switch 74b is electrically connected to the other electrode of the flying capacitor 72.

In addition, in the sixth embodiment, an output terminal of the TAD converter 28 is electrically connected to the microcomputer 14 in place of the control unit 30.

The multiplexer 70 works to select any one of the voltages across respective cells Bij to thereby establish electrical connection between a selected one cell Bij and the flying capacitor 72. This applies a selected one voltage across a selected one cell Bij across the flying capacitor 72 to thereby charge the flying capacitor 72 up to the selected one voltage across a selected one cell Bij.

When the flying capacitor 72 is charged up to the selected one voltage across a selected one cell Bij, the multiplexer 72 works to disconnect the electrical connection between the selected one voltage across a selected one cell Bij and the flying capacitor 72.

Thereafter, the switch member 74 works to turn on both the first switch 74a and second switch 74b so that one and the other electrodes of the capacitor 72 are electrically connected to the input terminal and the ground terminal of the TAD converter 28, respectively. This allows the charged voltage across the flying capacitor 72 to be applied to the TAD converter 28 so that the charged voltage across the flying capacitor 72 can be measured by the TAD converter 28.

As described above, the switch member 74 allows the TAD converter 28 to be electrically isolated from the high-voltage system including the battery pack 10 and the motor generator.

In addition, the multiplexer 70 is also electrically connected to the reference voltage unit 32. The multiplexer 70 works to select the output voltage of the reference voltage unit 32 to thereby apply the output voltage of the reference voltage unit 32 across the flying capacitor 72.

The reference voltage unit 32 is configured to operate on the sum of the voltages across the respective three adjacent cells B1, B2, and B3 as its power supply voltage to thereby generate a plurality of reference voltage values within a preset voltage range.

That is, a reference voltage value to be applied to the TAD converter 28 for the highest-potential cell B1 as the upper limit of the input voltage signal Vin may be required to be higher than the voltage across the highest-potential cell B1. In this case, division of the voltage across the highest-potential cell B1 may not generate the reference voltage value.

However, the configuration set forth above reliably generates the reference voltage value to be applied to the TAD converter 28 higher than the voltage across the highest-potential cell B1. This makes it possible to accommodate the upper and lower limits expected as the voltage across a cell Bij in a preset voltage range of a plurality of reference voltages to be generated by the reference voltage unit 32.

This generates an approximating characteristic curve for the TAD converter 28 that has higher accuracy within a voltage range defined by the upper limit and the lower limit expected as the voltage across a corresponding cell Bij. In addition, the configuration of the voltage monitoring system 1E uses the single TAD converter 28, thus reducing the number of processes required to generate an approximating characteristic curve for the single TAD converter 28.

Note that, in the sixth embodiment, the microcomputer 14 is programmed to carry out the voltage monitoring routine illustrated in FIG. 7 in place of the control unit 30.

Other operations of the voltage monitoring system 1E are substantially identical to those of the voltage monitoring system 1.

As described above, the voltage monitoring system 1E according to the sixth embodiment is configured to provide:

the flying capacitor 72; and the switch member 74 that can selectively establish electrical connection between both electrodes of a cell Bij and those of the flying capacitor 72.

Specifically, when measuring the voltage across a cell Bij, the voltage monitoring system 1E is configured to apply the charged voltage across the flying capacitor 72 to the input terminal of the TAD converter 28.

This achieves, in addition to the first, second, fourth, and fifth effects, the eleventh effect of reducing the number of TAD converters 28 in relation to the number of cells Bij.

Seventh Embodiment

A voltage monitoring system 1F according to a seventh embodiment of the present invention will be described hereinafter with reference to FIG. 17.

The structure of the voltage monitoring system 1F according to the sixth embodiment is substantially identical to that of the voltage monitoring system 1E according to the sixth embodiment except for the following different points. So, like parts between the voltage monitoring systems according to the sixth and seventh embodiments, to which like reference characters are assigned, are omitted or simplified in description.

Figure 17:
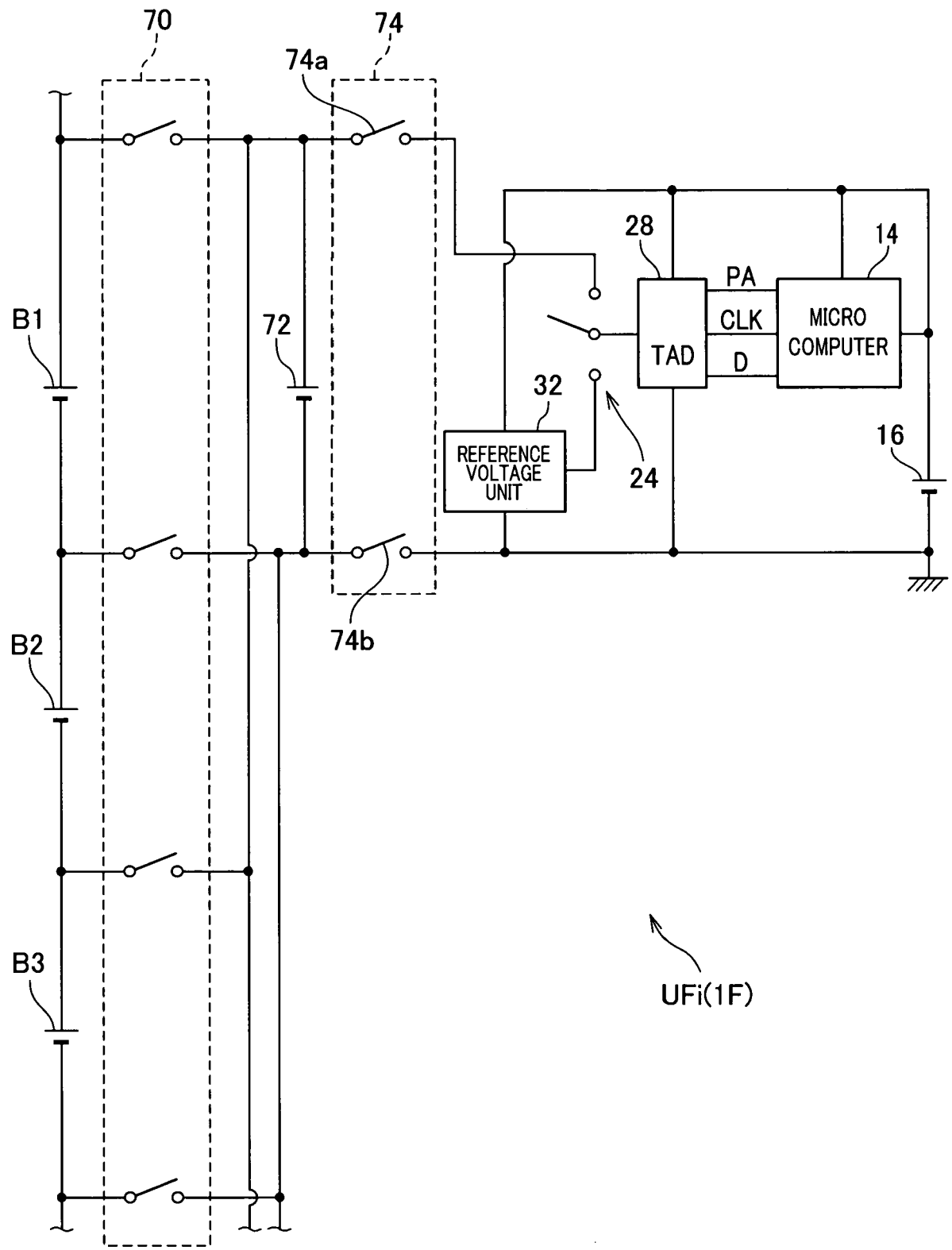
FIG. 17 is a circuit diagram schematically illustrating an example of the circuit structure of a monitoring unit of a voltage monitoring system according to a seventh embodiment of the present invention.

FIG. 17 schematically illustrates an example of the circuit structure of a monitoring unit UFi of the voltage monitoring system 1F.

In each monitoring unit UFi, the reference voltage unit 32 according to the seventh embodiment is different in arrangement from the reference voltage unit 32 according to the sixth embodiment.

Specifically, the reference voltage unit 32 according to the seventh embodiment is arranged at a lower voltage system side. The reference voltage unit 32 is electrically connected at its positive power supply terminal to the positive terminal of the low voltage battery 16, and at its ground terminal to the negative terminal of the low voltage battery 16. This allows the reference voltage unit 32 to operate on a voltage across the low voltage battery 16 as its power supply voltage.

Each monitoring unit Ui includes a single selector 24. The selector 24 is electrically connected to the input terminal of the TAD converter 28, to the output of the reference voltage unit 32, to the first switch 74a of the switch member 74, and to the microcomputer 14 in place of the control unit 30. The ground terminal of the reference voltage unit 32 is electrically connected to the second switch 74b of the switch member 74.

Under control of the microcomputer 14, the selector 24 is operative to select the output voltage of the reference voltage unit 32 to thereby apply the selected output voltage to the input terminal of the TAD converter 28. This allows the microcomputer 14 to perform the operations in steps S40 to S50 of the subroutine in step S14 for the TAD converter 28. This achieves the cubic characteristic curve for the TAD converter 28 (see step S50).

Under control of the microcomputer 14, the selector 24 is operative to select the charged voltage across the flying capacitor 72 to thereby apply the selected charged voltage across the flying capacitor 72 to the input terminal of the TAD converter 28.

This allows the charged voltage across the flying capacitor 72 to be measured by the TAD converter 28.

As described above, the switch member 74 allows the TAD converter 28 to be electrically isolated from the high-voltage system including the battery pack 10 and the motor generator.

Other operations of the voltage monitoring system 1F are substantially identical to those of the voltage monitoring system 1E.

As described above, the voltage monitoring system 1F according to the seventh embodiment is configured to, when measuring the voltage across a cell Bij, apply the charged voltage across the flying capacitor 72 to the input terminal of the TAD converter 28.

This achieves, as well as the sixth embodiment, an effect of reducing the number of TAD converters 28 in relation to the number of cells Bij.

Eighth Embodiment

A voltage monitoring system 1G according to an eighth embodiment of the present invention will be described hereinafter with reference to FIGS. 18 and 19.

The structure of the voltage monitoring system 1G according to the eighth embodiment is substantially identical to that of the voltage monitoring system 1 according to the first embodiment except for the following different points. So, like parts between the voltage monitoring systems according to the first and eighth embodiments, to which like reference characters are assigned, are omitted or simplified in description.

Figure 18:
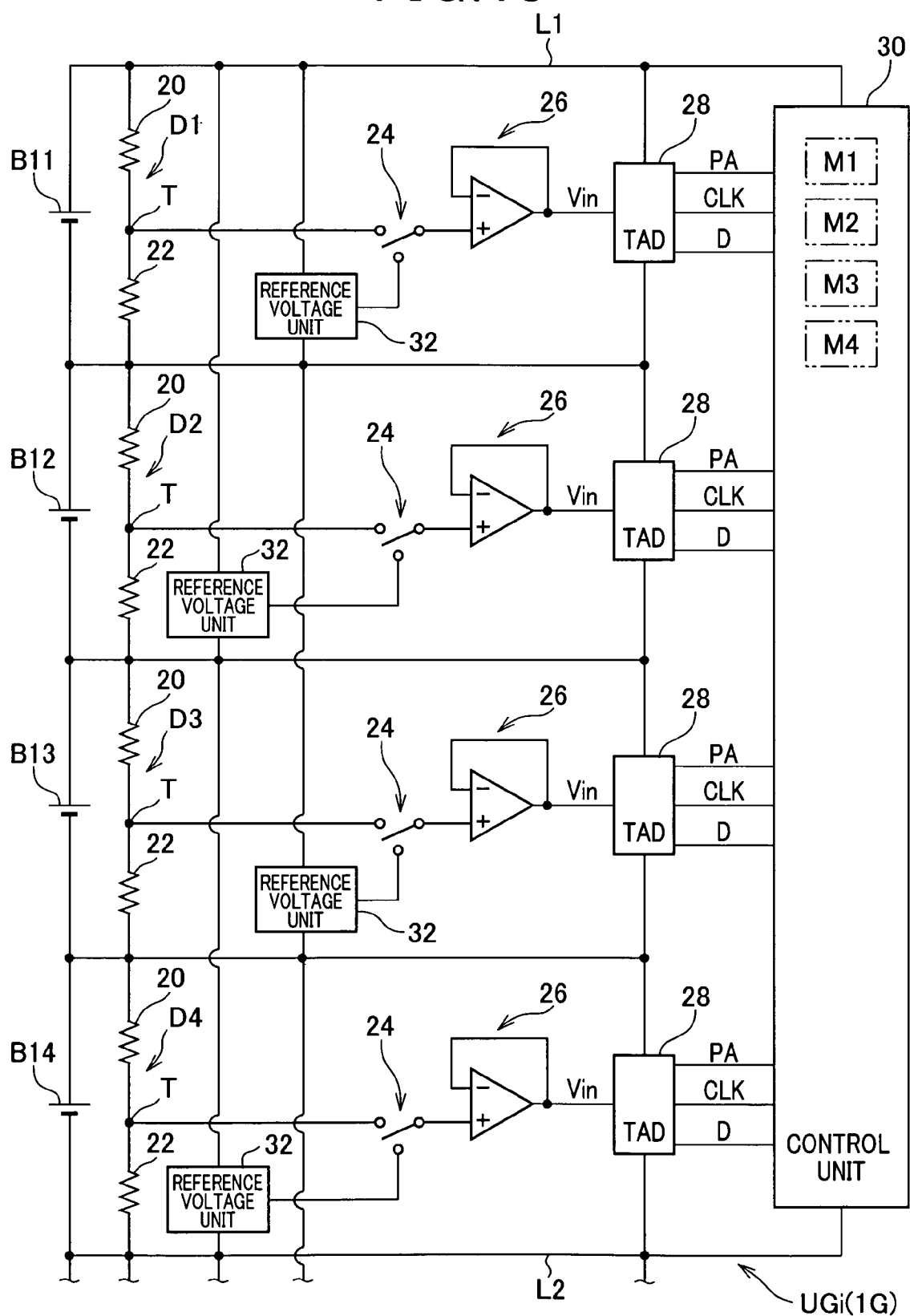
FIG. 18 is a circuit diagram schematically illustrating an example of the circuit structure of a monitoring unit of a voltage monitoring system according to an eighth embodiment of the present invention.

FIG. 18 schematically illustrates an example of the circuit structure of a monitoring unit UGi of the voltage monitoring system 1G.

One of the reference voltage units 32, which corresponds to the highest potential cell B11, is configured to operate on the voltage across the highest potential cell B11 as its power supply voltage to thereby generate a plurality of reference voltage values within a preset voltage range.

Like the third embodiment, each of the remaining reference voltage units 32, which corresponds to a cell Bij, is configured to operate on the sum of the voltage across a corresponding cell Bij and a high-potential side cell Bij-1 adjacent thereto as its power supply voltage to thereby generate a plurality of reference voltage values within a preset voltage range.

The configuration set forth above expands a preset voltage range of a plurality of reference voltages to be generated by each reference voltage unit 32 corresponding to a cell Bij except for the highest potential cell B11 such that the expanded preset voltage range includes upper and lower limits that are expected as the voltage across a cell Bij except for the highest potential cell B11.

In the eighth embodiment, a reference voltage value to be applied to the TAD converter 28 for the highest-potential cell B11 as the upper limit of the input voltage signal Vin may be required to be higher than the voltage across the highest-potential cell B11. In this case, division of the voltage across the highest-potential cell B11 may not generate the reference voltage value. The TAD converter 28 for the highest-potential cell B11 will be referred to as "the highest-potential TAD converter 28" hereinafter.

In order to address such a problem, the control unit 30 is programmed to, when an output voltage of the corresponding reference voltage unit 32 is inputted to the highest-potential TAD converter 28, evaluate the reliability of the output voltage of the corresponding reference voltage unit 32 based on an output value of the digital data D from the TAD converter 28.

Based on the result of the evaluation, the corresponding reference voltage unit 32 is configured to calculate an approximating characteristic curve for the highest-potential TAD converter 28.

Figure 19:
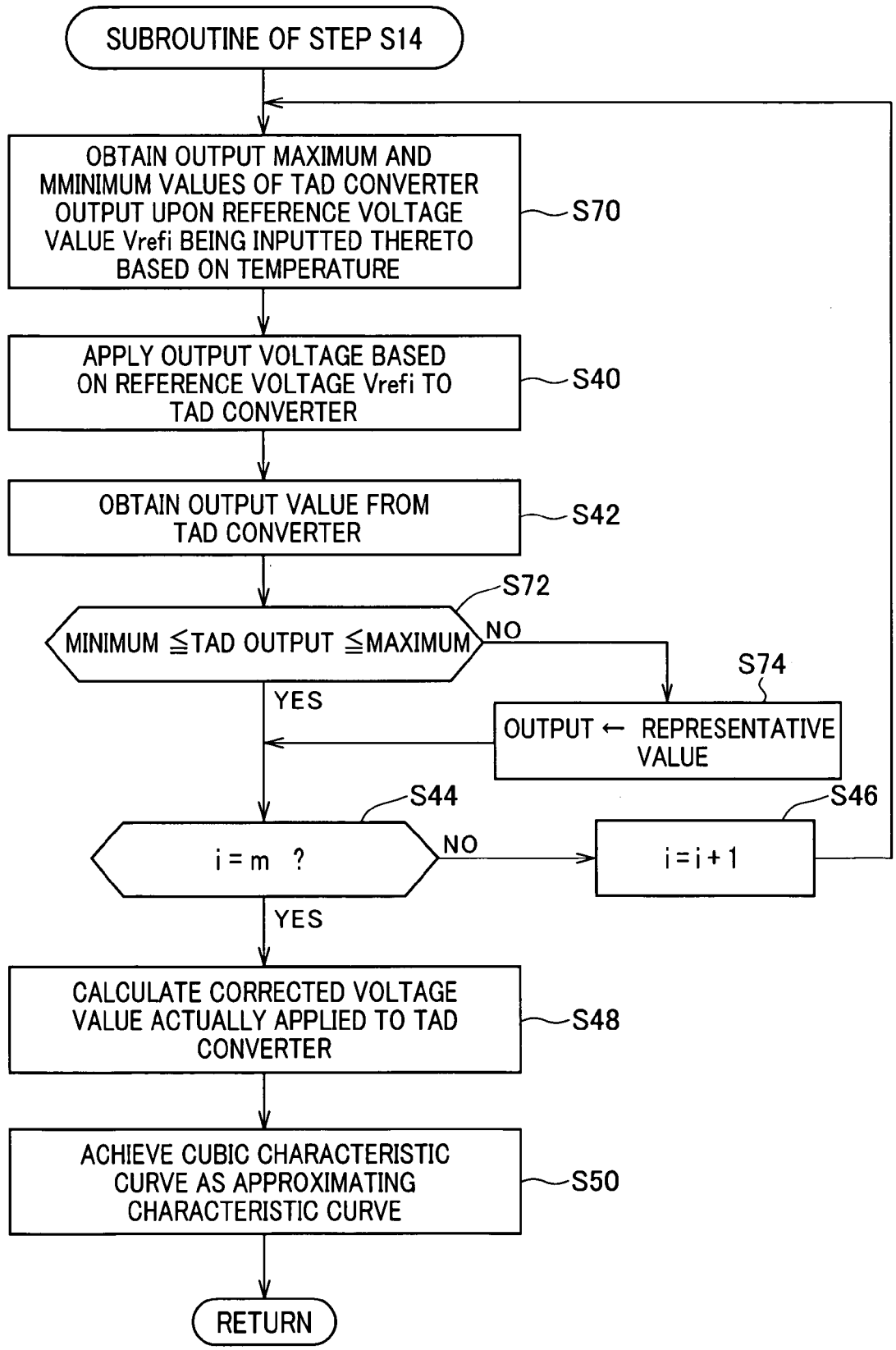
FIG. 19 is a flowchart schematically illustrating a subroutine of step S14 illustrated in voltage measuring routine according to the eighth embodiment.

Next, operations to be executed by the control unit 30 in the subroutine of step S14 according to the eighth embodiment will be fully described in accordance with FIG. 19. Like operations between the subroutines of step S14 according to the first and eighth embodiments, to which like reference characters are assigned, are omitted or simplified in description.

In the subroutine of step S14, the control unit 30 obtains a maximum value and a minimum value of the output of the TAD converter 28 upon each reference voltage value Vrefi being inputted to the highest-potential TAD converter 28 in accordance with temperature information. Note that the control unit 30 uses the temperature information that has been obtained during an approximating characteristic curve for a TAD converter 28 for a cell Bij except for the heist potential cell B11 being determined (see steps S20 to S24).

Specifically, in step S70, based on the temperature information and individual difference information, the control unit 30 obtains the maximum value and the minimum value of the output of the highest-potential TAD converter 28 upon each reference voltage value Vrefi being inputted to the highest-potential TAD converter 28.

The individual difference information represents individual differences between the output characteristics of the respective TAD converters 28 to be installed for each monitoring unit UGi. The individual difference information can be designed as data tables and stored in, for example, the ROM or RAM of the control unit 30, or designed as programs and embedded in the voltage monitoring program. The individual difference information has been determined by, for example, many tests and/or simulations using the voltage monitoring system 1G.

More specifically, the control unit 30 calculates the maximum and minimum values of the output of the highest-potential TAD converter 28 based on maps M4.

The maps M4 represent a variable of each of the maximum and minimum values of the output of the highest-potential TAD converter 28 upon each reference voltage Vrefi being inputted thereto and a variable of the temperature around the highest-potential TAD converter 28. The maps M4 can be designed as data tables and stored in, for example, the ROM or RAM of the control unit 30, or designed as programs and embedded in the voltage monitoring program.

The maps M4 have been determined by, for example, many tests and/or simulations using the voltage monitoring system 1G based on the individual differences between the output characteristics of the respective TAD converters 28 to be installed for each monitoring unit UGi.

At the moment immediately after shifting to the subroutine of step S14 from that of step S12, the control unit 30 sets the index "i" to "1" to thereby select the reference voltage Vref1 as the reference voltage value Vrefi in step S70.

After completion of the operation in step S70, the control unit 30 performs the operations in steps S40 and S42 that are the same as those illustrated in FIG. 10.

After completion of the operation in step 842, the control unit 30 determines whether the obtained output value of the highest-potential TAD converter 28 upon the reference voltage value Vrefi being inputted thereto is not less than the obtained minimum value and not greater than the obtained maximum value in step S72. This evaluates the reliability of each reference voltage value Vrefi.

When it is determined that the obtained output value of the highest-potential TAD converter 28 upon the reference voltage value Vrefi being inputted thereto is less than the obtained minimum value or greater than the obtained maximum value (NO in step S72), the control unit 30 replaces the output value of the highest-potential TAD converter 28 with a previously provided representative value in steps S743

The representative value can be determined based on reference output characteristic selected from the output characteristics of the respective TAD converters 28 to be installed in the voltage monitoring system 1G. It is desired that the reference output characteristic be an averaged characteristic, in other words, a median characteristic.

After completion of the operation in step S74 or when it is determined that the obtained output value of the highest-potential TAD converter 28 is not less than the obtained minimum value and not greater than the obtained maximum value YES in step S72), the control unit 30 shifts to the operation in step S44.

Other operations of the voltage monitoring system 1G are substantially identical to those of the voltage monitoring system 1.

As described above, the voltage monitoring system 1G according to the seventh embodiment is configured to, when each reference voltage value Vrefi is inputted to the highest-potential TAD converter 28, evaluate the reliability of each reference value Vrefi based on an output value of the highest-potential TAD converter 28 and the measured temperature.

This configuration achieves, in addition to the first, second, and fourth effects, a twelfth effect of evaluating the reliability of information to be used to calculate an approximating characteristic curve of the highest-potential TAD converter 28.

The voltage monitoring system 1G according to the eighth embodiment is configured to, when the obtained output value of the highest-potential TAD converter 28 upon the reference voltage value Vrefi being inputted thereto is less than the obtained minimum value or greater than the obtained maximum value, replace the output value of the highest-potential TAD converter 28 with the previously provided representative value.

This configuration achieves, in addition to the first, second, and fourth effects, a thirteenth effect of determining an approximating characteristic curve for the highest-potential cell B11 even if the reliability of each reference value Vrefi is reduced.

Ninth Embodiment

A voltage monitoring system according to a ninth embodiment of the present invention will be described hereinafter with reference to FIGS. 20 and 21.

The structure of the voltage monitoring system according to the ninth embodiment is substantially identical to that of the voltage monitoring system 1 according to the first embodiment except for the following different points. So, like parts between the voltage monitoring systems according to the first and ninth embodiments, to which like reference characters are assigned, are omitted or simplified in description.

As described above, the variation of output values of a TAD converter 28 due to fluctuations in temperature is relatively high when a value of the input voltage signal Vin becomes relatively high. For this reason, in order to evaluate the reliability of a specific reference voltage unit 32 like the eighth embodiment, it is desired that the temperature around a TAD converter 28 corresponding to the specific reference voltage unit 32 be previously measured using the reference voltage value Vref3. This is because a range of the variations between the non-linear output characteristic curves of each of the TAD converters 28 at the reference voltage value Vref3 is the widest in all ranges of the variations therebetween at the remaining reference voltages (see the value Vb in FIG. 4).

In order to keep high the reliability of the temperature measurement at the evaluation, as described in the eighth embodiment, it is desired to cause at least one reference unit 32 used to measure the temperature to operate on the sum of the voltages across respective cells as its power supply voltage.

For this reason, as illustrated in FIG. 2, when each reference voltage unit 32 is configured to operate on a single cell Bij, the reliability of the reference voltage Vref3, which is a precondition for evaluating the reliability of each reference value Vrefi may be an issue.

In order to address such an issue, the subroutine in step S10 is changed in the following subroutine.

Figure 20:
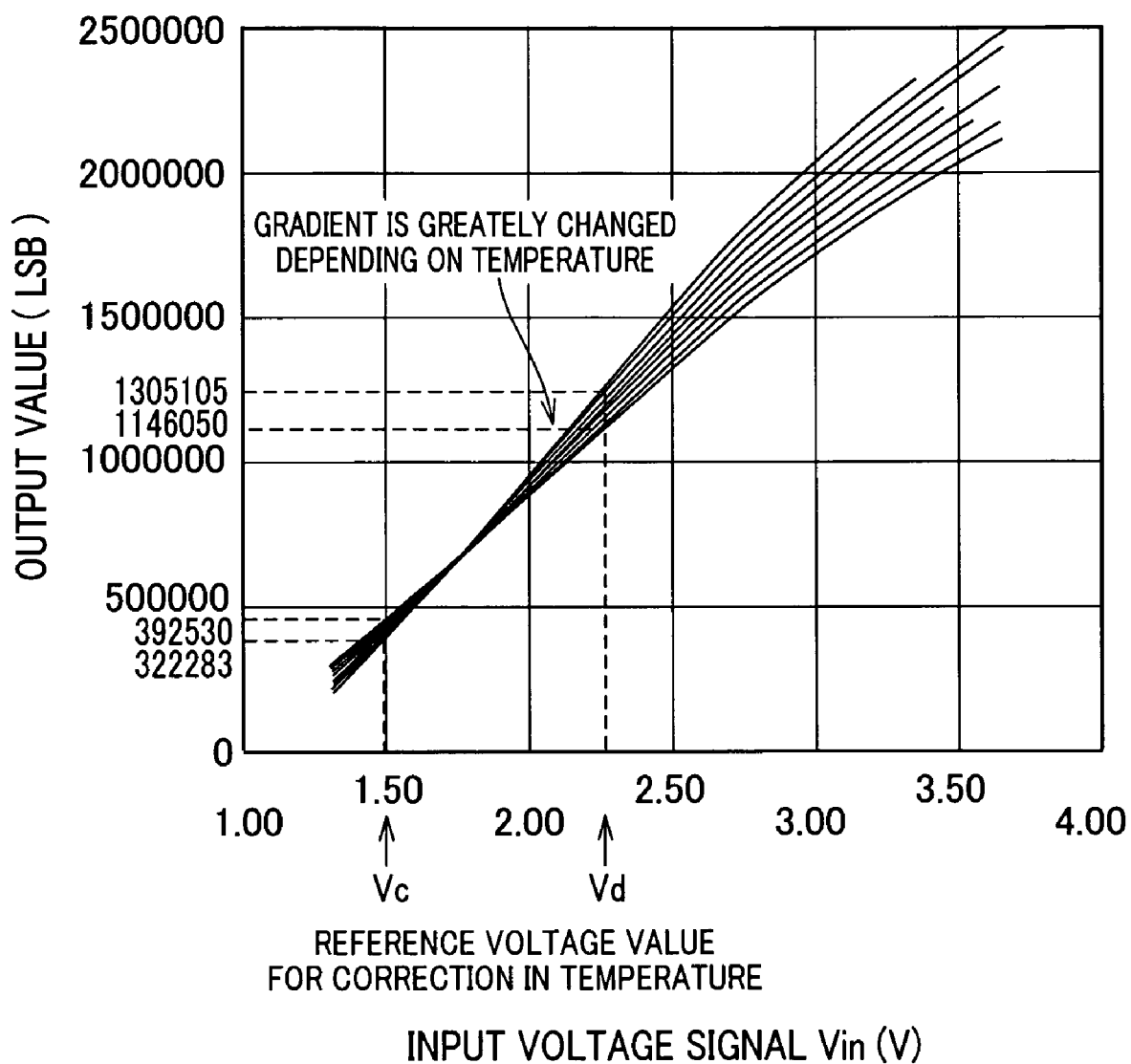
FIG. 20 is a graph schematically illustrating output characteristic curves of a TAD converter according to a ninth embodiment of the present invention.

FIG. 20 schematically illustrates output characteristic curves of a TAD converter 28 depending on temperature corresponding to FIG. 4.

The variation of the output value of a TAD converter 23 due to fluctuations in temperature is relatively small at a relatively lower level in the input voltage signal Vin. However, the variation in the gradient of the tangent to the output value of the TAD converter 28 with reference to the input voltage signal Vin is great at a relatively lower level in the input voltage signal Vin.

For this reason, the control unit 30 is programmed to:

calculate the gradient of the tangent to the output value of each TAD converter 28 with reference to each of reference voltage values Vc and Vd for correction in temperature that lie within the relatively lower level range in the input voltage signal Vin is calculated; and measure the temperature around each TAD converter 28 based on the calculated gradients for a corresponding one TAD converter 28.

This can keep high the reliability of measuring the temperature around each TAD converter 28.

Figure 21:
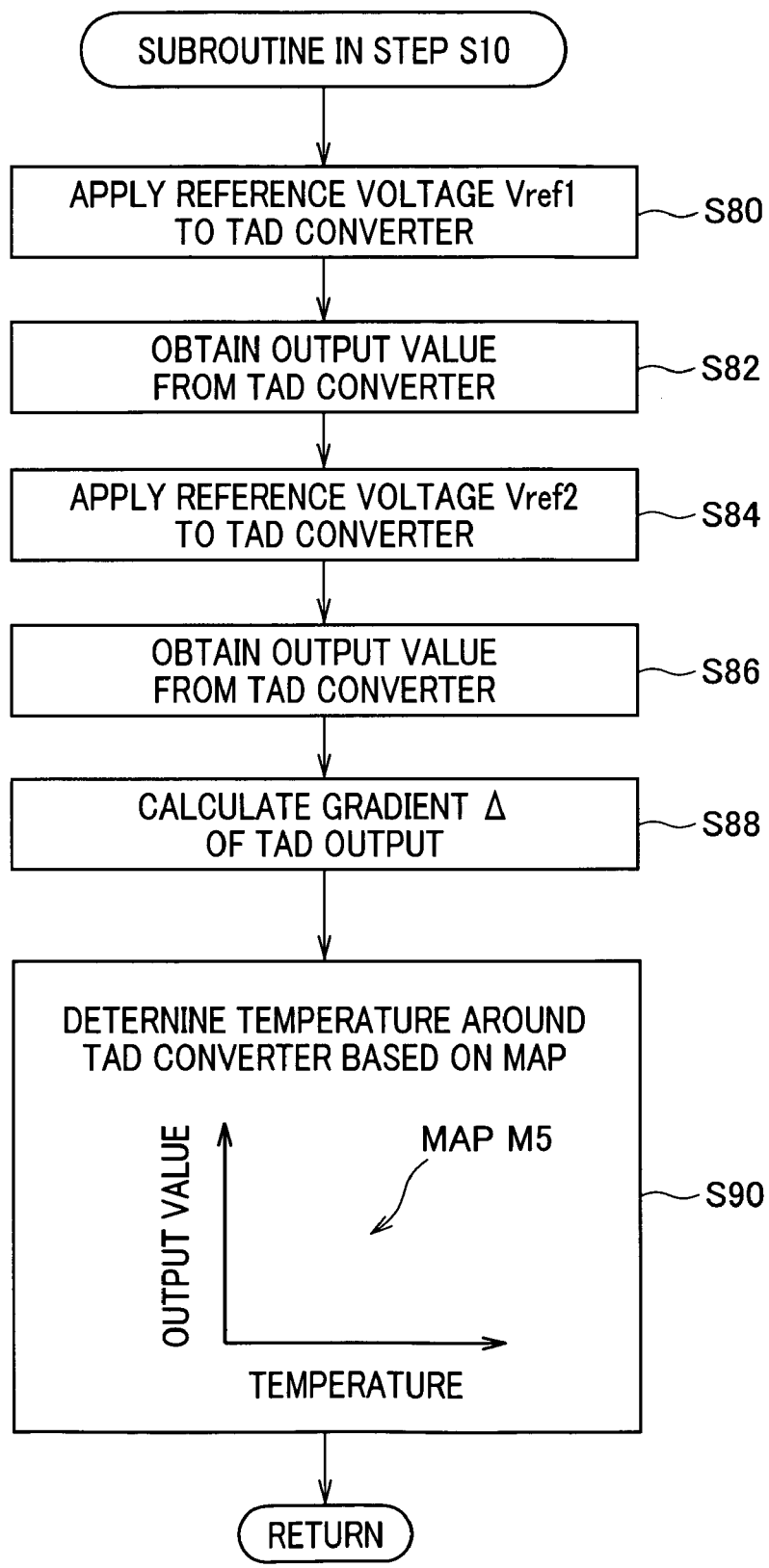
FIG. 21 is a flowchart schematically illustrating a subroutine of step S10 illustrated in voltage measuring routine according to the ninth embodiment.

Next, operations to be executed by the control unit 30 in the subroutine of step S10 according to the ninth embodiment will be fully described in accordance with FIG. 21.

In the subroutine of step S10, the control unit 30 controls each of the reference voltage units 32 and each of the selectors 24 to thereby apply, to a corresponding one of the TAD converters 28, one of the reference voltages Vref1 to Vrefm determined for temperature measurement in step S80.

For example, in the ninth embodiment, it is assumed that:

the reference voltage values Vref1 and Vref2 lie within the relatively lower level range in the input voltage signal Vin (see the values Vc and Vd in FIG. 20).

Thus, according to the assumption, the control unit 30 selects, as one voltage determined for temperature measurement, the reference voltage value Vref1 from all of the reference voltage values Vref1 to Vrefm, and applies it to each TAD converter 30 in step S80

Thereafter, in step S82, the control unit 30 obtains a first output value of the digital data D from each TAD converter 28.

Next, the control unit 30 selects, as another one voltage determined for temperature measurement, the reference voltage value Vref2 from all of the reference voltage values Vref1 to Vrefm, and applies it to each TAD converter 30 in step S84

Thereafter, in step 886, the control unit 30 obtains a second output value of the digital data D from each TAD converter 28.

In step S88, the control unit 30 calculates, as the gradient Δ, the ratio of the change from the first output value to the second output value to the change "Vref2−Vref1" from the reference voltage value Vref2 to the reference voltage value Vref1.

Next, in step S90, the control unit 30 determines the temperature around each of the TAD converters 28 based on the obtained gradient Δ and a corresponding one of maps M5.

Each of the maps M5 represents a relationship between a variable of the gradient Δ of a corresponding one of the TAD converters 28 and a variable of the temperature around the corresponding one of the TAD converters 28. The maps M5 for the respective TAD converters 28 can be designed as data tables and stored in, for example, the ROM or RAM of the control unit 30, or designed as programs and embedded in the voltage monitoring program.

The maps M5 have been determined by, for example, many tests and/or simulations using the voltage monitoring system 1.

Specifically, in step S90, based on the calculated gradient Δ of each TAD converter 28, the control unit 30 references a corresponding one of the maps M5 to thereby determine a value of the temperature around a corresponding TAD converter 28 associated with the obtained gradient Δ in the corresponding one of the maps M5. After completion of the operation in step S90, the control unit 30 returns to the start point of the subroutine of step S12 in the voltage measuring routine.

Other operations of the voltage monitoring system are substantially identical to those of the voltage monitoring system 1.

As described above, the voltage monitoring system according to the ninth embodiment is configured to determine a value of the temperature around each TAD converter 28 based on the calculated gradient Δ of a corresponding one TAD converter 28.

This configuration achieves, in addition to the first, second, and fourth effects, a fourteenth effect of measuring the temperature around each TAD converter 28 with high accuracy while limiting reference voltage values in the input voltage signal Vin to be applied to each TAD converter 28 within a relatively lower voltage range.

The aforementioned embodiments can be modified in the following manner.

In the first to eighth embodiments, the single reference voltage value Vref3 is selected as a voltage specified for temperature measurement, but the present invention is not limited thereto Specifically, the controller 30 can be programmed to:

obtain a plurality of output values of each TAD converter 28 upon a plurality of reference voltage values being inputted thereto;

determine a plurality of values of the temperature around each of the TAD converters 28 based on the plurality of output values of a corresponding one TAD converter and a corresponding one of maps M1; and calculate, as a final value of the temperature around each TAD converter 28, an average value of the plurality of values of the temperature around each of the TAD converters 28.

One or some voltage values except for the plurality of reference voltage values can be inputted to each TAD converter 28 as one or some voltages specified for temperature measurement.

The relationship between the variable of the output of the digital data D from each TAD converter 28 upon at least one voltage specified for temperature measurement being inputted thereto and the variable of the temperature around a corresponding one of the TAD converters 28 can be represented as information in the form except for the map format, for example, in the form of relational expressions.

The relationship between the variable of the gradient Δ of each TAD converter 28 and the variable of the temperature around the corresponding one of the TAD converters 28 can be represented as information in the form except for the map format, for example, in the form of relational expressions.

In each of the first, second, and eighth embodiments, the correction coefficient K for the voltage across each cell Bij is calculated based on the determined value of the variation of each of the resistances R1 and R2 of the first and second resistances 20 and 22 for each TAD converter 28, but the present invention is not limited thereto.

Specifically, a resistance of each of the first and second resistances 20 and 22 for each TAD converter 28 depending on the measured temperature around a corresponding one TAD converter 28 can be calculated. The voltage across each cell Bij can be calculated based on the calculated resistance of each of the first and second resistances 20 and 22 for each TAD converter 28.

In the third embodiment (see FIG. 13), the booster 48 is used to serve as a power supply source for one voltage reference unit 32 configured to measure the voltage across the highest-potential cell B11, but the present invention is not limited thereto.

Specifically, the booster 48 can be arranged to serve as a power supply source for each of the individual voltage reference units 32 configured to measure the voltage across a corresponding one cell Bij.

In the fourth embodiment (see FIG. 14), the level shift circuit 50 is used to apply an output value of the reference voltage unit 32 for one cell except for the highest potential cell B11 the input terminal of the TAD converter 28 for the highest potential cell B11, but the present invention is however not limited thereto.

Specifically, the level shift circuit 50 can be used to apply a reference voltage value Vrefi to each TAD converter 28 for measuring the voltage across each of two cells Bi1 and Bi2 in all cells Bi1 to Bi4 constituting each block. The level shift circuit 50 can be used to apply a reference voltage value Vrefi to each TAD converter 28 for measuring the voltage across each of cells except for lowest-side two cells Bn1 and Bn2 in all cells B11 to Bn4.

In the fifth embodiment (see FIG. 15), the reference TAD converter 28r for generating an approximating characteristic curve for each TAD converter 28 of each monitoring unit Ui is installed in each monitoring unit Ui, but the present invention is not limited thereto.

Specifically, when all of the TAD converters 28 for monitoring corresponding cells Bij of the battery pack 10 are closely arranged to each other to thereby make negligible the variation of output values of a TAD converter 28 due to fluctuations in temperature, a single reference TAD converter 28r for generating an approximating characteristic curve for each TAD converter 28 of the battery pack 10 can be installed in the battery pack 10.

In the fifth embodiment (see FIG. 15), the TAD converter 28 is provided for each cell Bij and configured to detect the battery across a corresponding one cell Bij, but the present invention is not limited thereto.

Specifically, a single TAD converter 28 can be provided for each group of three adjacent cells B1, B2, and B3 and configured to detect the voltages across respective cells Bj1, B2, and B3.

In this modification, the reference voltage unit 32 for the reference TAD converter 28r can be configured to reliably generate the reference voltage value to be applied to the reference TAD converter 28r based on the sum of the voltages across respective cells B1 to B3 as the power supply voltage of the reference TAD converter 28r. The sum of the voltages across the respective cells B1 to B3 is higher than the voltage across the highest-potential cell B1.

This makes it possible to properly generate a plurality of reference voltages.

In the sixth embodiment (see FIG. 16) or the seventh embodiment (see FIG. 17), the multiplexer 70 works to select any one of all the voltages across respective all cells Bij to apply a selected one voltage across the flying capacitor 72, but the present invention is not limited thereto.

Specifically, a plurality of flying capacitors can be provided in each monitoring unit Ui, and each cell Bij can be allocated to some of the plurality of flying capacitors in order to improve the speed for measuring the voltage across each cell Bij.

In this modification, it is desired to provide a reference voltage unit for each TAD converter to which a charged voltage of corresponding some of the plurality of flying capacitors are inputted.

In each of the second to eighth embodiments, the method for measuring the temperature around each TAD converter 28 according to the ninth embodiment can be used.

In the first embodiment, the temperature dependence of each voltage follower 26 is not considered, but the present invention is not limited thereto.

In the first embodiment, when the divided value of the voltage across each cell Bij by the corresponding first and second resistors 20 and 22 is in agreement with any one of the reference voltages Vref1 to Vrefm, the temperature dependence of a corresponding one voltage follower 26 can also be compensated.

However, when the divided value of the voltage across a cell Bij by the corresponding first and second resistors 20 and 22 is different from any one of the reference voltages Vref1 to Vrefm, the temperature dependence of a corresponding one voltage follower 26 may cause an error in an output voltage of a corresponding one TAD converter 28. This error is caused by the temperature dependence of the corresponding one voltage follower 26.

Thus, the control unit 30 can:

calculate, based on the measured temperature, an actual voltage outputted from each voltage follower 26 upon each of the reference voltage values Vref1 to Vrefm being applied to a corresponding one TAD converter 28; and calculate an approximating characteristic curve for each TAD converter 28 based on the calculated actual output voltages of a corresponding one voltage follower 26 for respective reference voltages Vref1 to Vrefm.

In this modification, it is preferred that, when measuring each cell Bij, the control unit 30:

compensate for the temperature dependence of each of the voltage follower 26 in the calculated digital value of the voltage across each cell Bij in the process (b); and after the compensation, carry out the operation in step S66 based on the compensated calculated digital value of the voltage across each cell Bij in the process (b).

In the first to eighth embodiments, the temperature dependence of each of the switching elements including the selectors 24 and 44 and/or the multiplexer 70, and/or that of means installed in the control unit 30 for generating the clock signal CLK cannot be considered, but the present invention is not limited thereto.

Specifically, the control unit 30 can carry out temperature compensation of each of electronic elements being used to measure the voltage across each cell Bij and depending on temperature described in each of the first to ninth embodiments.

Information indicative of the relationship between the variation in the output value of each TAD converter 28 and that in the temperature therearound is not limited to the gradient of the tangent to the output value of each TAD converter 28 with reference to the input voltage signal Vin. For example, as information indicative of the relationship between the variation in the output value of each TAD converter 28 and that in the temperature therearound, the second order differential of the output value of each TAD converter 28 can be used.

Means for converting an input voltage signal to digital data is not limited to the structure of each TAD converter 28. For example, the ring oscillator 28a can be replaced with a single NAND gate.

In each of the first to ninth embodiments, each TAD 28 is designed to measure the voltage across a corresponding one cell Bij, but the present invention is not limited thereto.

Specifically, the TAD 28 can be designed to measure the voltage across each cell Bij or across each battery module, or to measure the voltage across the low voltage battery 16.

In the aforementioned embodiments, the voltage monitoring system 1 is configured to cyclically generate and update an approximating characteristic curve for each TAD converter 28 so as to reflect the temperature dependence of a corresponding one TAD converter 28, but the present invention is not limited thereto.

Specifically, before, for example, installation in each monitoring unit Ui or shipment of the corresponding any one of the voltage monitoring unit 1 and 1A to 1G, a plurality of approximating characteristic curves for each TAD converter 28 at respective representative values of temperature can be stored in, for example, the control unit 30. The plurality of approximating characteristic curves for each TAD converter 28 at the respective representative values of temperature have been generated by:

measuring an output value of each TAD converter 28 upon the voltage input signal being input thereto.

Every time the control unit 30 measures a value of the temperature around each TAD converter 28, the control unit 30 can select any one of the plurality of approximating characteristic curves for a corresponding one TAD converter 28 based on the measured value of the temperature around the corresponding one TAD converter 28.

In each of the first to ninth embodiments, the method for calculating, using algebra operation, values of unspecified coefficient parameters to be contained in a cubic function curve for each TAD converter 28 is used. The method is based on: a preset required number of reference voltage values being inputted to each TAD converter 28; and the actual output values of the digital data D from the corresponding required number of reference voltage values.

The present invention is however not limited to the method.

Specifically, an alternative method in place of the method set forth above can be used.

The alternative method includes;

calculating, using multi-variable analysis, values of the unspecified coefficient parameters to be contained in a cubic function curve for each TAD converter 28 based on: a large number of reference voltage values to each TAD converter 28 and the actual output values of the digital data D therefrom.

The large number of the reference voltage values to each TAD converter 28 is grater than the required number of the reference voltage values to each TAD converter 28.

As the approximating characteristic curves, various types of functional curves can be used. In place of generating the approximating characteristic curve for each TAD converter 28, generating information, such as a map, representing the relationship between the variable of the output voltage of each TAD converter 28 and that of the voltage input signal being inputted thereto can be used.

In this modification, when values of the variable of the input voltage signal being actually inputted to a TAD converter 28 are different from input values of the variable for the information (map), interpolating method can be used. This interpolating method interpolates between actual output values of the TAD converter 28 corresponding to the values of the input variable for the information (map) to thereby calculate intermediate output values of the TAD converter 28 corresponding to the actual input values of the input voltage signal.

In each of the first to ninth embodiments, the temperature information measured by each TAD converter 28 can be utilized for various purposes except for detecting (monitoring) voltages.

In the aforementioned embodiments, the TAD converters 28 are applied to the voltage monitoring systems, but the present invention is not limited to the applications. Specifically, a TAD converter 28 can be applied to an analog-to-digital converting apparatus for:

receiving an output voltage signal from at least one of sensors installed in, for example, a vehicle control system; and converting the received output voltage signal as the input voltage signal Vin to digital data by the TAD converter 28.

In this application, the output voltage signal from the at least one of sensors may originally have a nonlinear characteristic with respect to physical quantities sensed by the at least one of sensors.

In this case, it is preferred to create an approximating characteristic curve of the output characteristic curve of the TAD converter 28 based on a plurality of reference voltage values in the input voltage signal. Each of the plurality of reference voltage values corresponds to one of the physical quantities sensed by the at least one of sensors. The approximating characteristic curve represents the relationship between output values of the TAD converter 28 and the physical quantities sensed by the at least one of sensors.

While there has been described what is at present considered to be the embodiments and their modifications of the present invention, it will be understood that various modifications which are not described yet may be made therein, and it is intended to cover in the appended claims all such modifications as fall within the true spirit and scope of the invention.

What is claimed is:

1. An analog-to-digital converting apparatus comprising:
a converting unit having an input terminal and an input-output characteristic, the input-output characteristic having temperature dependence, the converting unit being configured to carry out a process of converting an input voltage signal through the input terminal to digital data;
a specified voltage applying unit configured to apply a specified voltage to the input terminal of the converting unit;
a temperature determining unit having information representing a relationship between a variable of an output of the converting unit and a variable of a temperature around the converting unit according to the temperature dependence of the input-output characteristic of the converting unit, the temperature determining unit being configured to, when the specified voltage is applied to the input terminal of the converting unit, determine a value of the temperature around the converting unit based on the information and the specified voltage; and
a reducing unit configured to reduce temperature dependence of the process of converting the input voltage signal to the digital data based on the determined value of the temperature around the converting unit.

2. The analog-to-digital converting apparatus according to claim 1, wherein:
the specified voltage applying unit comprises a reference voltage applying unit configured to apply, as the specified voltage, a plurality of reference voltage values to the input terminal of the converting unit, the plurality of reference voltage values being different from each other,
the information represents the relationship between:
a value of the variable of the output of the converting unit upon each of the plurality of reference voltage values being inputted to the converting unit; and
the variable of the temperature around the converting unit according to the temperature dependence of the input-output characteristic of the converting unit, and
the reducing unit is configured to reduce the temperature dependence of the process of converting the input voltage signal to the digital data based on the determined value of the temperature around the converting unit, the temperature dependence of the process of converting the input voltage signal to the digital data including a temperature dependence of the reference voltage applying unit.

3. The analog-to-digital converting apparatus according to claim 1, wherein the input voltage signal is based on a voltage across a battery, and the converting unit is configured to measure the voltage across the battery based on the digital data converted thereby.

4. The analog-to-digital converting apparatus according to claim 3, further comprising a resistance circuit having a resistance and configured to divide the voltage across the battery to thereby generate a divided value of the voltage thereacross,
wherein the input voltage signal is based on the divided value of the voltage across the battery generated by the resistance circuit, and
the reducing unit is configured to reduce the temperature dependence of the process of converting the input voltage signal to the digital data based on the determined value of the temperature around the converting unit, the temperature dependence of the process of converting the input voltage signal to the digital data including a temperature dependence of the measured voltage of the battery due to fluctuations in temperature of the resistance of the resistance circuit.

5. The analog-to-digital converting apparatus according to claim 3, wherein the battery is made up of a plurality of series-connected battery cells, the plurality of series-connected battery cells constituting a battery pack, and the input voltage signal is based on the voltage across at least one of the battery cells.

6. The analog-to-digital converting apparatus according to claim 5, wherein:
the specified voltage applying unit comprises a reference voltage applying unit configured to:
generate a plurality of reference voltage values based on at least two adjacent battery cells in the plurality of series-connected battery cells, the plurality of reference voltage values being different from each other; and
apply, as the specified voltage, the plurality of reference voltage values to the input terminal of the converting unit,
the information represents the relationship between:
a value of the variable of the output of the converting unit upon each of the plurality of reference voltage values being inputted to the converting unit; and
the variable of the temperature around the converting unit according to the temperature dependence of the input-output characteristic of the converting unit.

7. The analog-to-digital converting apparatus according to claim 6, further comprising a resistance circuit having a resistance and configured to divide the voltage across one of the plurality of series-connected battery cells to thereby generate a divided value of the voltage thereacross, the voltage across the one of the plurality of battery cells being the highest potential in all of the plurality of battery cells,
wherein the converting unit is shared for the plurality of series-connected battery cells and configured to measure the voltage across each of the plurality of series-connected battery cells, and the generated divided value of the voltage across the one of the plurality of battery cells is applied to the input terminal of the converting unit.

8. The analog-to-digital converting apparatus according to claim 6, further comprising a booster configured to boost the voltage across one of the plurality of battery cells, the one of the plurality of battery cells having the highest potential in all of the plurality of battery cells, wherein the reference voltage applying unit includes a first reference voltage applier and a second reference voltage applier, the first reference voltage applier is configured to generate the plurality of reference voltage values based on the boosted voltage by the booster, and the second reference voltage applier is configured to generate the plurality of reference voltage values for another one of the plurality of series-connected battery cells based on the at least two adjacent battery cells in the plurality of series-connected battery cells, the plurality of reference voltage values being different from each other.

9. The analog-to-digital converting apparatus according to claim 6, further comprising a level shift circuit configured to shift a level of one of the plurality of reference voltage values to a different level, wherein the converting unit includes a first converter and a second converter, the first converter being configured to convert, as the input voltage signal, the shifted one of the plurality of reference voltage values to the digital data, and to measure the voltage across one of the series-connected battery cells based on the digital data converted thereby, the one of the series-connected battery cells having the highest potential in all of the battery cells, the second converter being configured to convert, as the input voltage signal, the voltage across another one of the series-connected battery cells, and to measure the voltage across another one of the series-connected battery cells based on the digital data converted thereby.

10. The analog-to-digital converting apparatus according to claim 5, wherein the converting unit includes a plurality of converters and a specific converter, each of the converting units being configured to convert, as the input voltage signal, the voltage across a corresponding one of the battery cells, the specified voltage applying unit comprises a reference voltage applying unit configured to:

generate a plurality of reference voltage values, the plurality of reference voltage values being different from each other; and apply, as the specified voltage, the plurality of reference voltage values to the input terminal of the specific converter, and the information represents the relationship between:

a value of the variable of the output of the specific converter upon each of the plurality of reference voltage values being inputted to the specific converter; and the variable of the temperature around the specific converter according to the temperature dependence of the input-output characteristic of the specific converter.

11. The analog-to-digital converting apparatus according to claim 5, further comprising:

a flying capacitor;

a selecting unit configured to select the voltage across any one of the plurality of series-connected battery cells and to apply the selected voltage across the flying capacitor so as to charge the flying capacitor; and an applying unit configured to switchably apply the charged voltage across the flying capacitor to the converting unit to thereby allow the converting unit to measure the voltage across any one of the plurality of series-connected battery cells.

12. The analog-to-digital converting apparatus according to claim 5, wherein the specified voltage applying unit comprises a reference voltage applying unit configured to:

generate a plurality of reference voltage values, the plurality of reference voltage values being different from each other; and apply, as the specified voltages the plurality of reference voltage values to the input terminal of the converting unit, and the information represents the relationship between:

a value of the variable of the output of the converting unit upon each of the plurality of reference voltage values being inputted to the converting unit; and the variable of the temperature around the converting unit according to the temperature dependence of the input-output characteristic of the converting unit, further comprising:

a reliability evaluating unit configured to evaluate a reliability of each of the plurality of reference voltage values based on:

the value of the variable of the output of the converting unit upon each of the plurality of reference voltage values being inputted to the converting unit; and the determined value of the temperature around the converting unit.

13. The analog-to-digital converting apparatus according to claim 1, wherein the information represents the relationship between:

a value of the variable of the output of the converting unit upon the specified voltage being inputted to the converting unit as the input voltage signal; and the variable of the temperature around the converting unit according to the temperature dependence of the input-output characteristic of the converting unit.

14. The analog-to-digital converting apparatus according to claim 1, wherein the specified voltage applying unit comprises a reference voltage applying unit configured to apply, as the specified voltage, a plurality of reference voltage values to the input terminal of the converting unit, the plurality of reference voltage values being different from each other, and the information represents the relationship between:

a value of the variable of the output of the converting unit within a voltage range defined by the plurality of reference voltage values; and the variable of the temperature around the converting unit according to the temperature dependence of the input-output characteristic of the converting unit.

15. The analog-to-digital converting apparatus according to claim 1, wherein the converting unit comprises a ring oscillator that operates on the input voltage signal as a power supply voltage thereof.

16. The analog-to-digital converting apparatus according to claim 1, wherein the converting unit comprises a plurality of inverters each operating on the input voltage signal as a power supply voltage thereof, the converting unit being configured to convert the input voltage signal to the digital data by utilizing the fact that a signal delay time of each of the inverters upon a signal being transferred through the plurality of inverters depends on the input voltage signal.

* * * * *